(12) United States Patent
Pupalaikis

(10) Patent No.: US 6,567,030 B1
(45) Date of Patent: May 20, 2003

(54) SAMPLE SYNTHESIS FOR MATCHING DIGITIZERS IN INTERLEAVED SYSTEMS

(75) Inventor: Peter J. Pupalaikis, Ramsey, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/090,047

(22) Filed: Feb. 27, 2002

(51) Int. Cl.[7] .................................................. H03M 1/12
(52) U.S. Cl. ......................... 341/155; 341/126; 341/143
(58) Field of Search ................................. 341/155, 143, 341/120, 156, 118, 126

(56) References Cited

U.S. PATENT DOCUMENTS 5,392,044 A * 2/1995 Kotzin et al. ............... 341/155
5,568,142 A * 10/1996 Velazquez et al. ........... 341/126
6,380,879 B2 * 4/2002 Kober et al. ................. 341/155
6,480,610 B1 * 11/2002 Fang et al. .................. 381/321

* cited by examiner

Primary Examiner—Brian Young
Assistant Examiner—John Nguyen
(74) Attorney, Agent, or Firm—Frommer Lawrence & Haug, LLP; William S. Frommer; Gordon Kessler

(57) ABSTRACT

A system that improves acquisition fidelity in high-bandwidth interleaved acquisition systems through a process called sample-synthesis. Synthesizers are used to make data from one digitizing element appear as though it were sampled by another digitizing element. This method overcomes the Nyquist limitations imposed on a single digitizer. The topology for this system is described, and an explanation of the operation is provided. Then, details are provided for the consideration of Infinite Impulse Response (IIR) and Finite Impulse Response (FIR) filter implementations of sample synthesizers.

15 Claims, 29 Drawing Sheets

```
#define D 16         // number of digitizers
define K 101        // FIR filter length float A[D][D][K];    // filter coefficients A[from][to][delay]
float x[D][K];       // filter delay taps x[from][delay]
float y[D];          // synthetic outputs y[to]

float Match(float Input, int f)
{
        for (int t=0; t <= D; ++t)
                // for every synthesized output
                y[t] = 0;       // clear the accumulator for (int d=0; d < D; ++d)
        { // for every adc synthesizer
                for (int k=K-1; k > 0; --k)
                { // for every point in the delay taps except the first
                        x[d][k] = x[d][k-1];    // delay the input if (f == d)
                                // if the synthesizer is the one where the actual input came to
                                for (t=0; t < D; ++t)
                                        // for every synthesized output
                                        if (t != f)
                                                y[t] += x[f][k] * A[f][t][k];  // apply the FIR
                }
        } x[f][0] = Input;  // insert the input into the synthesizer connected to this adc for (t=0; t < D; ++t)
        { // for every synthesized output
                y[t] += x[f][0] * A[f][t][0];  // generate the final synthesized output x[t][0] = y[t];                // apply the synthesized output to the corresponding
        }                                      // synthesizer's synthetic input port return y[0];                           // return the output of an arbitrary synthesizer
}
```

FIG. 6

```
#define D 16         // number of digitizers
define K 101        // FIR filter length float A[D][D][K];    // filter coefficients A[from][to][delay]
float x[D][K];       // circular buffer of filter delay taps x[from][delay]
int p = 0;           // index of next input into circular buffer float Match(float Input, int f)
{
        int m,t,k,n;

// calculate index of last input into circular buffer
        p = ((m = p) == K-1) ? 0 : ++p;

// insert the input into the circular buffer of the synthesizer connected
        // to this adc, while clearing the next input location in the others
        for (t = 0; t < D; ++t)
                x[t][m] = (f == t) ? Input : 0;

// starting with the last sample input to the circular buffer, apply the
        // FIR on each synthesizer output to each sample
        for (k = p, n = K-1; k < K ; ++k,--n)
                for (t = 0; t < D; ++t)
                        if (t != f)
                                x[t][m] += x[f][k] * A[f][t][n];

// continue to apply the fir from the beginning of the circular buffer up to
        // the current sample
        if (p!=0)
                for (k = 0; k <= m ; ++k, --n)
                        for (t = 0; t < D; ++t)
                                if (t != f)
                                        x[t][m] += x[f][k] * A[f][t][n];

return x[0][m]; // return the input to an arbitrary synthesizer
}
```

FIG. 7

| FIG. 9A |
|---------|
| FIG. 9B |

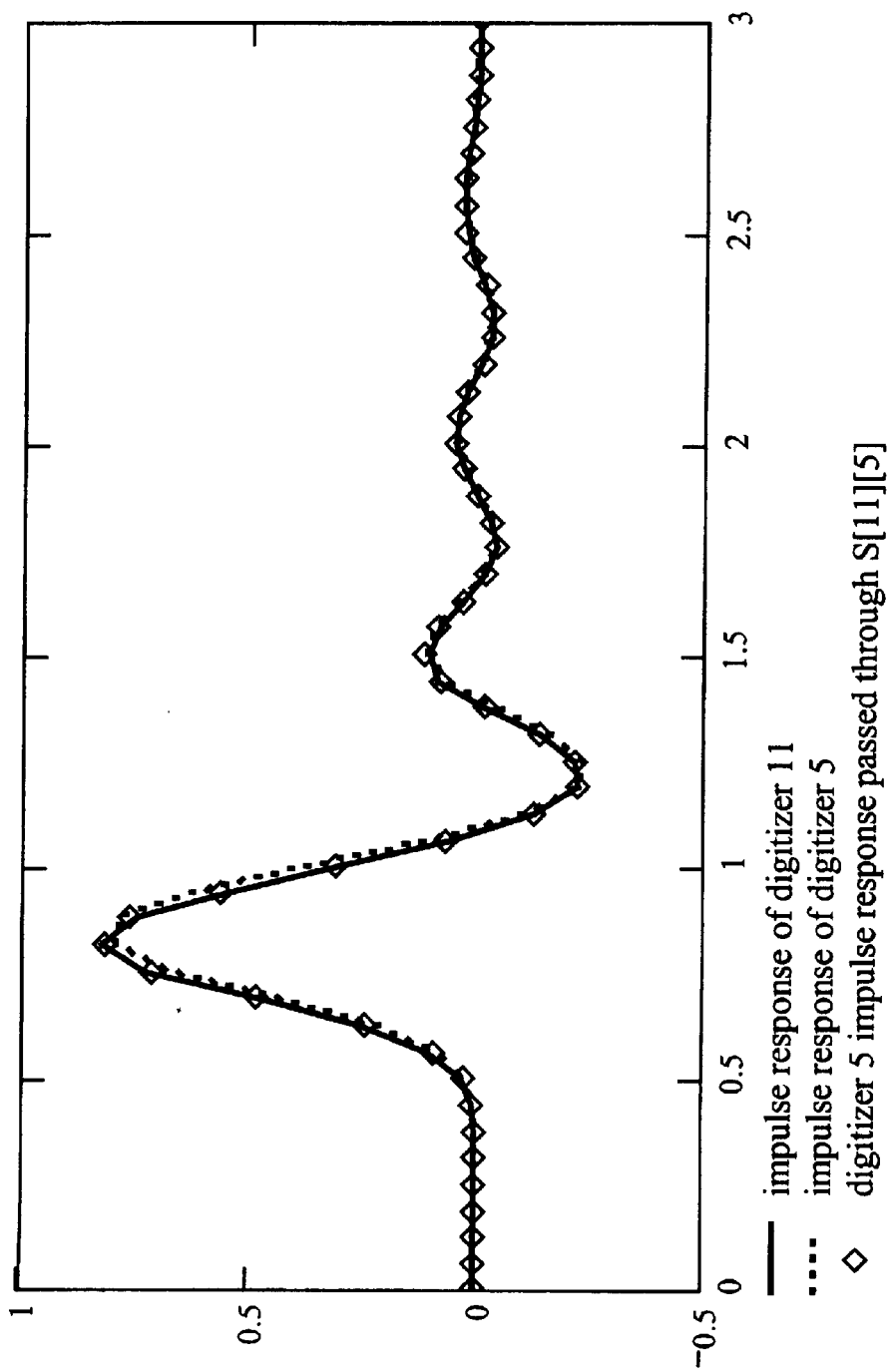
FIG. 18A | FIG. 18 | FIG. 18A | FIG. 18B | FIG. 18C | FIG. 18D

| FIG. 18 | FIG. 18A | FIG. 18B | FIG. 18C | FIG. 18D |

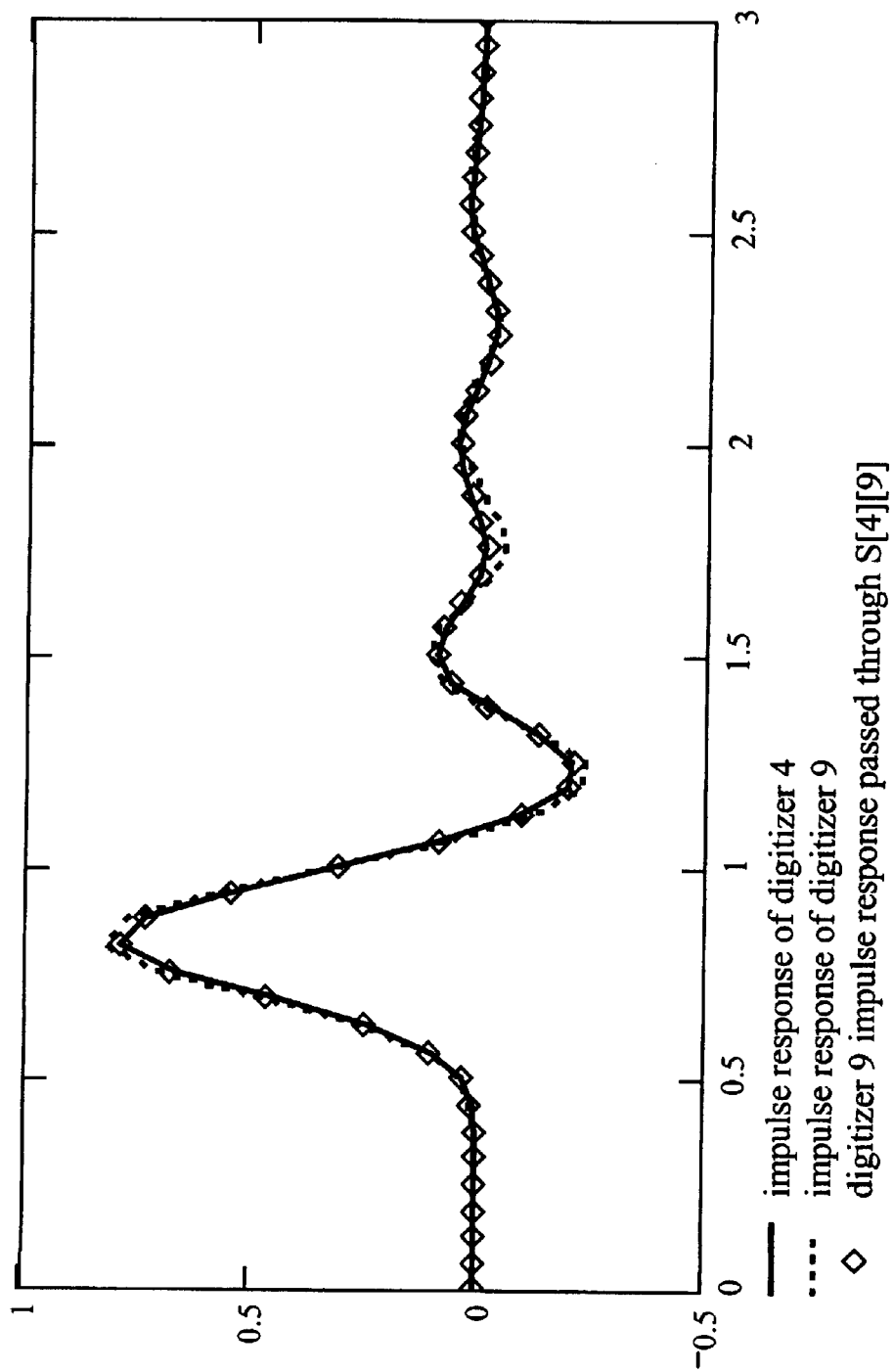
FIG. 18C | FIG. 18 | FIG. 18A | FIG. 18B | FIG. 18C | FIG. 18D

| FIG. 18 | FIG. 18A | FIG. 18B | FIG. 18C | FIG. 18D |

SAMPLE SYNTHESIS FOR MATCHING DIGITIZERS IN INTERLEAVED SYSTEMS

BACKGROUND OF THE INVENTION

The present invention relates generally to a system for matching digitizers in interleaved systems using a sample synthesis process.

Waveform digitizing technology is subject to the principle that the maximum speed (or sampling rate) of the fastest digitizing elements—generally in the form of analog-to-digital converters (ADCs)—lags behind the speed of the maximum bandwidth of the highest bandwidth systems. This means that in high bandwidth systems, the highest speed ADCs are simply incapable of sampling the analog signal at a rate sufficient to use the full resources of the high bandwidth systems.

Those skilled in the art of digital signal processing are familiar with Nyquist's criteria. This Nyquist criteria requires that a continuous signal sampled at a rate such that no frequency component is present in the analog signal above one half the sampling rate can be completely described by the sampled signal. See H. Nyquist, *Certain Factors Affecting Telegraph Speed*, Bell System Technical Journal, April 1924, p. 324; H. Nyquist, *Certain Topics in Telegraph Transmission Theory*, A.I.E.E. Trans., Vol. 47, April 1928, p.617. When Nyquist's criteria is not met, a phenomena called "aliasing" occurs. Aliasing results in some frequencies in the analog signal not being distinguishable from other frequencies in the sampled signal (i.e. some frequencies appear as other frequencies, hence the term "aliasing").

Because ADCs cannot satisfy the Nyquist criteria for the highest bandwidth systems, aliasing will occur if the analog signal is attempted to be sampled by a single ADC. This is because the bandwidth of the system being greater than one half the sample rate of that ADC. A single sampled waveform in which aliasing has occurred is generally not useful in any further digital device that would utilize such a sampled signal.

Many techniques have been developed to produce sufficiently oversampled, high-bandwidth waveforms, particularly in the area of high performance digital sampling oscilloscope (DSO) design. Each of these techniques is intended to overcome the sample rate limitations of ADCs. The present invention relates to a technique called "interleaving." Interleaving is the most widely used technique in digitizing systems designed for high bandwidth, high sample rate, long memory length, single-shot applications. Interleaving involves delivering an analog signal to multiple ADCs, each of which samples the waveform at precisely offset, but different interleaved times.

FIG. 8 shows a block diagram of a traditional interleaved system. In FIG. 8, a continuous analog signal 80 enters the system through a front-end amplifier 81. In a DSO, the front-end is designed to provide the appropriate input coupling, offset, and signal amplification. The analog signal is distributed from the front end to D independent samplers (or ADCs) 84. In FIG. 8, the transfer characteristics of each ADC path are shown as H[d] 83, where d is the digitizer number. Since the primary transfer characteristics of each path are sufficiently linear and because the effects of the ADC or other components in the signal path are indistinguishable from each other, the response characteristic of the entire path from front-end to digitizer is lumped into H[d]. Usually, the analog signal is also fed to trigger circuitry (not shown).

Each of the ADCs 84 in this system sample at a rate F, which results in an effective sample rate of D times F for the combination shown in FIG. 8. As can be seen, ADC 0 produces the first point in the waveform, ADC 1 produces the second point, etc . . . . The D-1 sample is generated by the last ADC, after which the sampling repeats with ADC 0 providing the next sample. Hence, in this system, ADC 0 provides samples 0, D, 2D, etc . . . . An example of this type of system is the LeCroy WavePro™ 960. This DSO takes a single-shot acquisition at a bandwidth of 2 GHz and a sample rate of 16 GS/s by-utilizing 16 ADCs each sampling at 1 GS/s.

While interleaving seemingly offers an unlimited sampling rate, practical design problems are numerous. Interleaving problems are manifest as degraded waveform integrity. This degradation appears as "interleaving artifacts." These artifacts are easily discernable from other types of degradation, such as random noise.

In order for an interleaved system to work properly, the signal delivered to each digitizer must be identical. Furthermore, the characteristics of each ADC must be identical. Matching signal path and ADC characteristics is not an easy task. In addition, the sample clock delivered to each ADC must be precisely timed.

Many commercially available ADCs designed for very high sample rates provide voltage controlled delay, gain, and offset adjustments so that each ADC can be adjusted (or matched) to one another. Despite these controls, a perfect match cannot be achieved. Furthermore, these ADCs ignore the fact that while the delay control is an absolute time delay, the gain control is a DC gain. Thus, it is not possible to provide a single control for both the gain and delay as a function of frequency. There is currently no way to control a frequency response mismatch between digitizers and the analog paths leading to each digitizer.

FIG. 9 illustrates an example of frequency mismatch between two ADCs. The top plot shows the responses 90, 91 of each ADC as a function of frequency. The bottom plot shows the alternating samples generated by the respective ADCs. Each succeeding sample is taken by the other ADC. The frequency mismatch results from the different response characteristics of the two ADCs. Because of this response mismatch, the sampled waveform is severely degraded. Note that adjustment of the time delay or gain of either digitizer will not correct this problem because the problem is the response of each respective ADC.

The problem is that the transfer characteristics (H[d]) for each ADC are not identical. For example, although the WavePro™ 960 is a DSO designed with advanced technologies to minimize variation in the ADC paths, the characteristics of the signal path to each ADC and certain attributes of the individual ADCs are still not matched. FIG. 10 and FIG. 11 show how multiple traces are easily distinguishable when the WavePro™ 960 is run in persistence mode using interleaving. (FIGS. 10 and 11 are described in more detail below) This is because each path from front-end to digitizer contains many different components having varying response characteristics. Furthermore, the digitizers themselves differ in their response characteristics due to an effect called sampling efficiency. While sampling efficiency is correctable by independently considering the digitized waveform from each ADC, for the purposes of this discussion, it is considered as part of the path response characteristics.

SUMMARY OF THE INVENTION

In summary, many techniques exist in the design of sampled systems, particularly in the design of digital sampling oscilloscopes. The most widely used technique in the design of high-bandwidth, high-sample rate, single-shot DSOs is interleaving. Interleaving can create artifacts that serve to degrade the quality of the resultant digitized waveform. These artifacts are difficult if not impossible to remove through traditional methods of electronics design.

Therefore, in accordance with this invention, a system is provided that is capable of digitally matching the sampling characteristics of each ADC in an interleaved system.

The preferred embodiment of the invention provides a synthesizer for matching a plurality of interleaved digitizers in an acquisition system operating at an interleaved sampling rate. The synthesizer has a digitizer input port for inputting a digitized waveform sample output from a corresponding interleaved digitizer. A synthetic input port is used to input synthetic output samples corresponding to the synthesizer. These synthetic output samples are generated by synthesizers corresponding to the other interleaved digitizers. The synthesizer also has a filter bank. Each filter in the filter bank corresponds to one of the interleaved digitizers and produces an output sample from the input digitized waveform sample on the basis of the input synthetic output samples. Each output sample has the sampling characteristics of the corresponding interleaved digitizer.

In accordance with the invention, the output sample produced by the filter which corresponds to the interleaved digitizer for the synthesizer is a matched output sample. Further, the output samples produced by the filters corresponding to the other interleaved digitizers are synthetic output samples.

Another aspect of the invention is that each filter may be a finite impulse response (FIR) filter, an infinite impulse response (IIR) filter, or another type of filter. In addition, each digitizer may be an analog-to-digital converter (ADC).

A second embodiment of the invention provides a method of matching a plurality of interleaved digitizers in an acquisition system operating at an interleaved sampling rate. The method comprises the steps of inputting a digitized waveform sample output from a corresponding interleaved digitizer; inputting synthetic output samples corresponding to the synthesizer from a plurality of synthesizers corresponding to the other interleaved digitizers; and producing output samples from the input digitized waveform-sample on the basis of the input synthetic-output samples using a plurality of filters. Each filter corresponds to one of the interleaved digitizers. Each output sample has the sampling characteristics of the corresponding interleaved digitizer.

In the second embodiment, the output sample produced by the filter which corresponds to the interleaved digitizer for the synthesizer is a matched output sample. Further, the output samples produced by the filters corresponding to the other interleaved digitizers are synthetic output samples.

Another aspect of the second embodiment is that each filter may be a finite impulse response (FIR) filter, an infinite impulse response (IIR) filter, or another type of filter. In addition, each digitizer may be an analog-to-digital converter (ADC).

A third embodiment of the invention provides a system for matching interleaved digitizers using sample synthesis. The system has a plurality of interleaved digitizers for sampling an input analog signal to produce digitized waveform samples. Also, a plurality of synthesizers correspond to the interleaved digitizers. Each synthesizer has a digitizer input port for inputting the digitized waveform samples output from the corresponding interleaved digitizers. A synthetic input port is used to input synthetic output samples corresponding to the synthesizer. These synthetic output samples are generated by synthesizers corresponding to the other interleaved digitizers. The synthesizer also has a filter bank. Each filter in the filter bank corresponds to one of the interleaved digitizers and produces an output sample from the input digitized waveform sample on the basis of the input synthetic output samples. Each output sample has the sampling characteristics of the corresponding interleaved digitizer.

In the third embodiment, the output sample produced by the filter which corresponds to the interleaved digitizer for the synthesizer is a matched output sample. Further, the output samples produced by the filters corresponding to the other interleaved digitizers are synthetic output samples.

Another aspect of the third embodiment is that each filter may be a finite impulse response (FIR) filter, an infinite impulse response (IIR) filter, or another type of filter. In addition, each digitizer may be an analog-to-digital converter (ADC).

Other objects and advantages of the invention will in part be obvious and will in part be apparent from the specification and the drawings.

BRIEF DESCRIPTION OF THE DRAWINGS

For a more complete understanding of the invention, reference is made to the following description and accompanying drawings, in which:

FIG. 6 is a software listing for implementing the FIR filter sample synthesis system shown in FIG. 2;

FIG. 7 is a software listing equivalent to that in FIG. 6 which is optimized to reduce data bus activity;

DETAILED DESCRIPTION OF THE PREFERRED EMBODIMENTS

Figure 1:
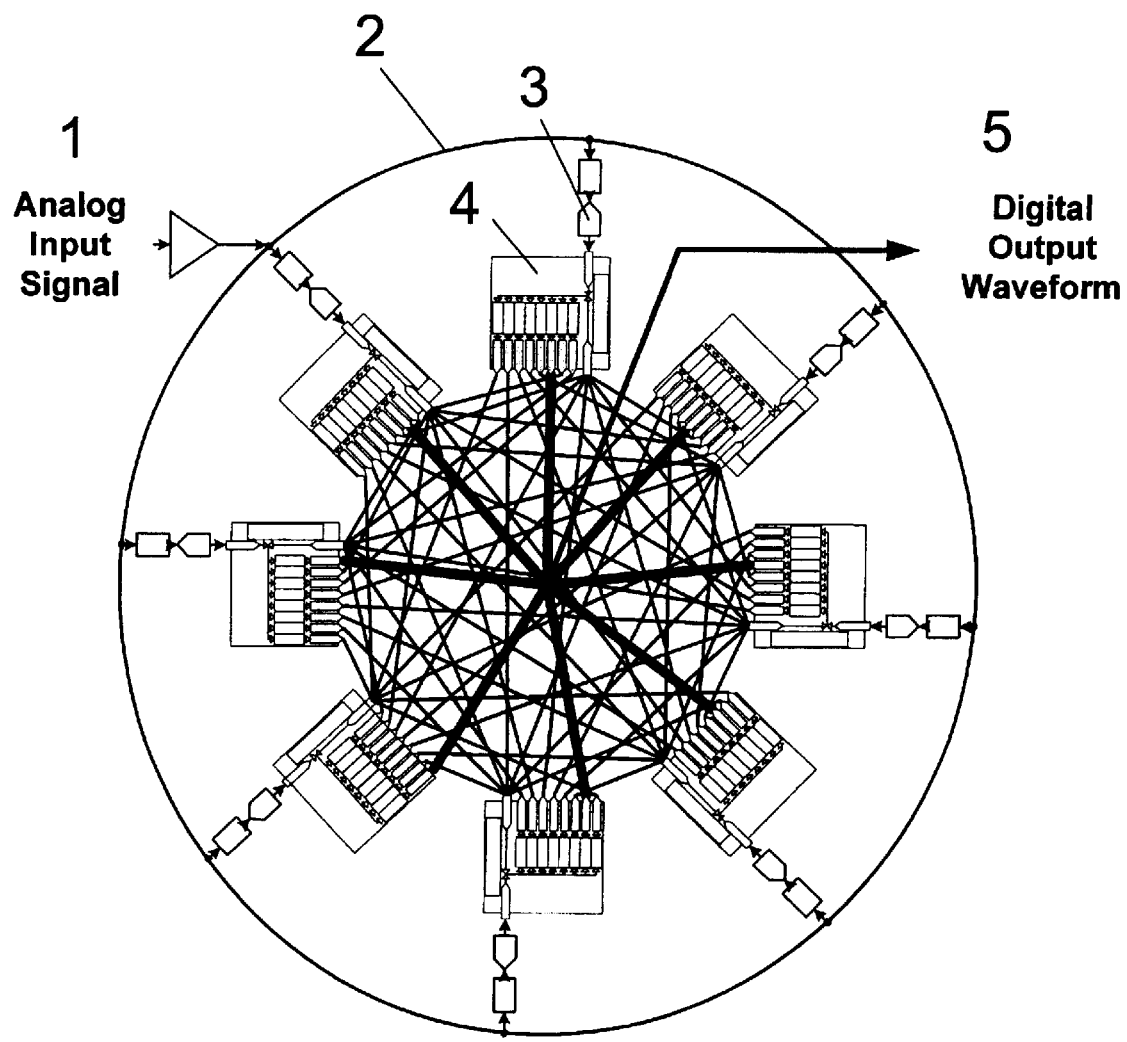
FIG. 1 shows a sample synthesis system according to the present invention used in a system having eight interleaved digitizers.

The preferred embodiments of the system according to the present invention will be described with reference to the accompanying drawings.

Interleaving is used when sampling a high frequency signal, because a single ADC cannot sample at a sufficient rate. The measure of a "sufficient" rate is a metric called the "oversampling ratio." This disclosure defines the oversampling ratio as the ratio of one half the sample rate (i.e. the Nyquist rate) to the bandwidth of the system. Hence, an oversampling ratio of 1 means that the sample rate is twice the bandwidth. Because many high bandwidth systems have a steep roll-off in response above the bandwidth (i.e. the system's performance is sharply degraded when sampling faster than the Nyquist rate), an oversampling ratio of 2–4 is usually required to be considered truly oversampled. High-performance single-shot DSOs are generally designed with enough interleaved ADCs to provide adequate oversampling at the maximum sampling rate of the system. For example, the LeCroy WavePro™ 960 has a bandwidth of 2 GHz. Utilizing all of the 960's ADCs for a single channel provides an oversampling ratio of 4, and in two-channel mode an oversampling ratio of 2. Both ratios are adequate for precision measurements that require oversampling of the signal.

Digital filtering can only be performed accurately when the acquisition system is oversampling the waveform. Digital filtering techniques are capable of generating virtually any required frequency response up to the Nyquist frequency with the system's signal-to-noise ratio (SNR) determining the quality of such filtering.

The present invention is concerned with matching individual ADC response characteristics, not with digital filtering the total, interleaved acquisition. However, one way to match frequency response characteristics is through the use of a digital filter. Considering the situation where the response characteristics are linear, then the transfer functions H[d] could be considered as linear transfer functions $H_d(s)$, where "s" is the Laplace variable. For this case, one approach to matching the response characteristic of digitizer "d" to some desired response characteristic would be to design a digital filter that emulates the response characteristic of the channel. For example, a digital filter that matches the waveform acquired on digitizer 1 to digitizer 0 would have a transfer function of:

$$H_{0,1}(z) = \frac{H_0(z)}{H_1(z)}$$

where $H_0(z)$ and $H_1(z)$ are digital filters that approximate the "s" domain response characteristics $H_0(s)$ and $H_1(s)$.

This oversimplified method of correction is actually not possible. Indeed, if it were the present invention might not be as advantageous. Because digital filters are to be applied to the individual ADCs, it must be considered that the ADCs are undersampling the signal. Again using the WavePro™ 960 as an example, each ADC samples the waveform at 1 GS/s (i.e. the Nyquist rate of an individual ADC is 500 MHz), but the bandwidth of the DSO is 2 GHz. This means that Nyquist's criteria is not met when the data from only one ADC is considered, therefore digital filtering is not possible on the individual ADC data. In other words, because Nyquist's criteria is not met by any individual ADC, there are no digital filters ($H_0(z)$ and $H_1(z)$) are possible that approximate the response characteristics ($H_0(s)$ and $H_1(s)$) at the sample rate of an individual ADC. This problem is always present in interleaved systems, and indeed this is the reason for employing an interleaved design in the first place. If it were possible to oversample the system with a single At)C, then interleaving would not be necessary.

The present invention solves this problem by enabling the correction of the frequency response of the data sampled by individual ADCs, even though each is undersampling the waveform. This is achieved by using an innovative digital filter structure. To conceptualize the present invention, it is assumed that the data is present from an individual ADC at the effective interleaved sample rate. If this data is present, the individual ADC would be sufficiently oversampling the input signal and accurate digital filtering would be possible. If digital filtering can accurately be performed, then the system can be filtered to have virtually any response. If the frequency response characteristics of all the ADCs are known (as described later), then it is possible to construct and apply digital filters to the data from a given ADC such that the filter output mimics the response of any of the other ADCs. In other words, it is possible to apply filters to a given ADC's sample history, to make it look as if it were sampled by any of the other ADCs in the interleaved system. It is therefore possible to generate data for any ADC at the effective interleaved sample rate. Although this argument may seem circular, it has been determined by the inventor that a steady-state system exists that satisfies this argument.

Figure 2:
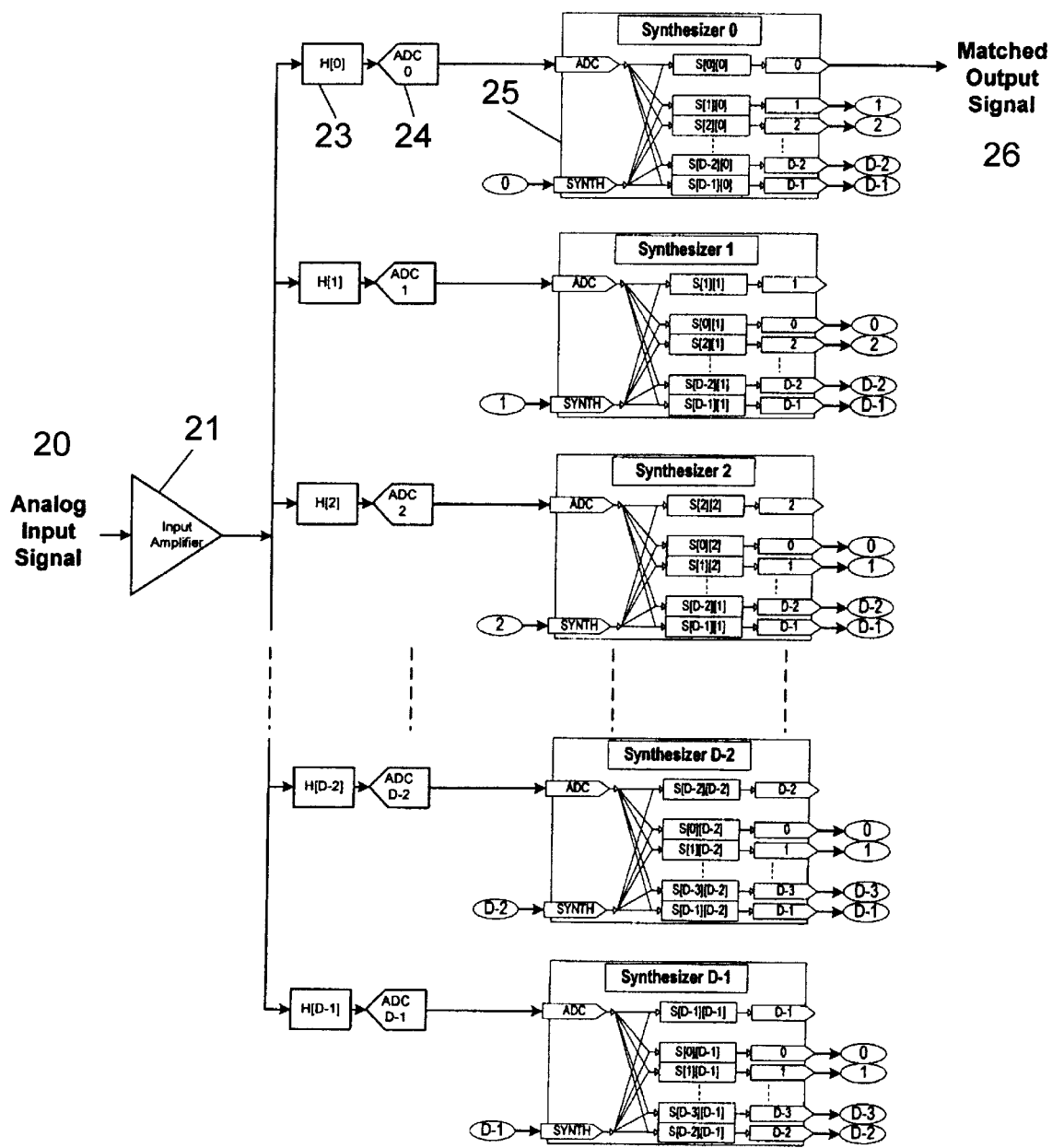
FIG. 2 shows an interleaved system according to the present invention that matches the response of the digitizers using sample synthesis.
Figure 8:
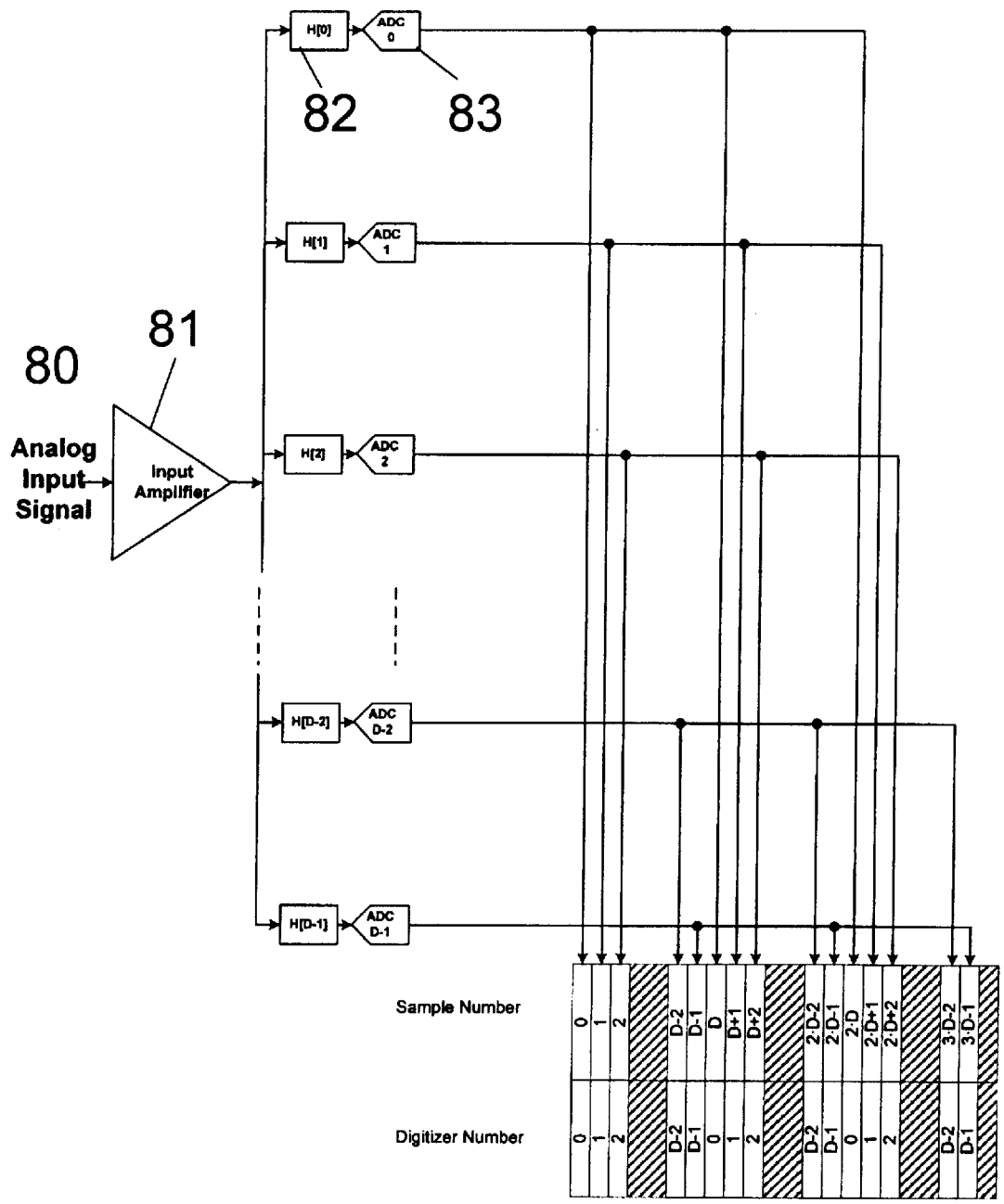
FIG. 8 shows a traditional interleaved system demonstrating the order of sample generation in such a system.
Figures 9, 9A:
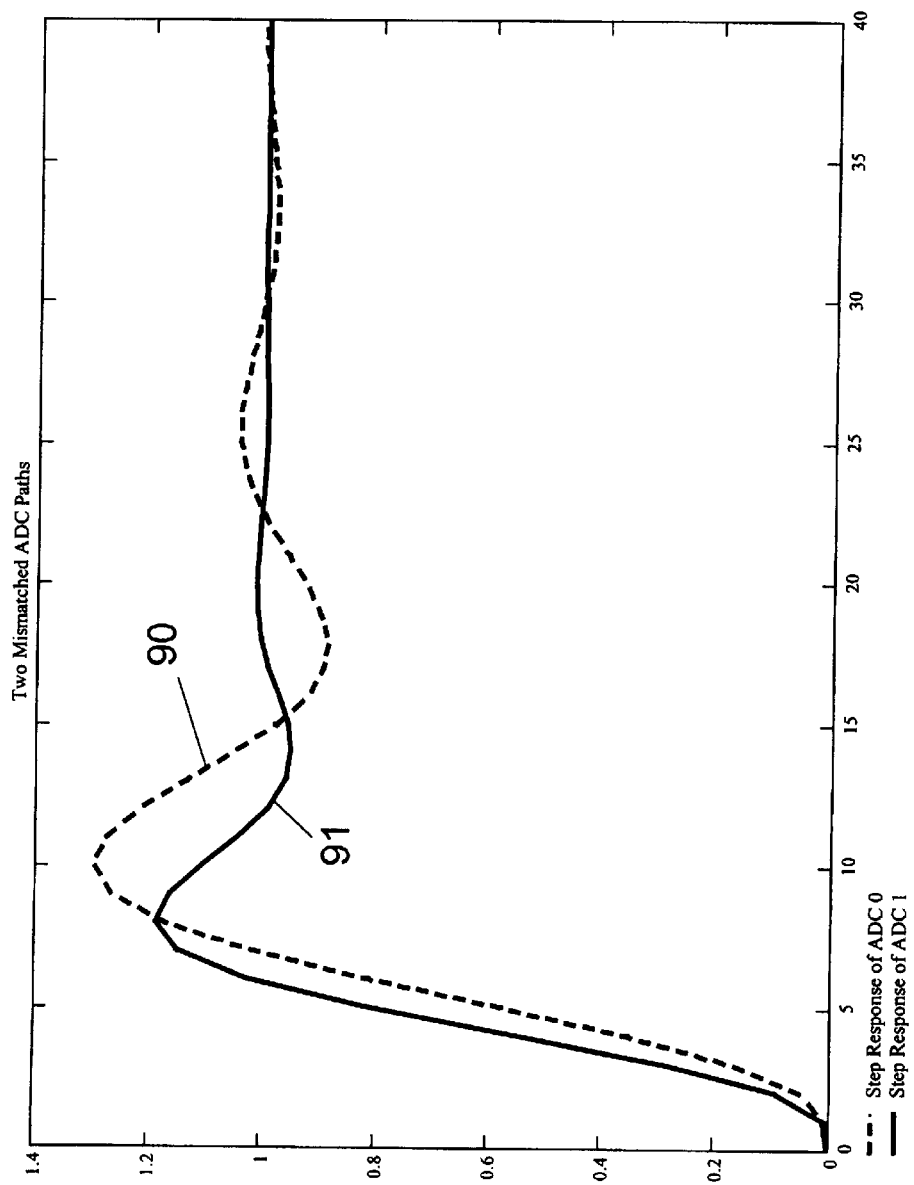
FIG. 9 shows the mismatched response characteristics of two ADCs.
Figure 9B:
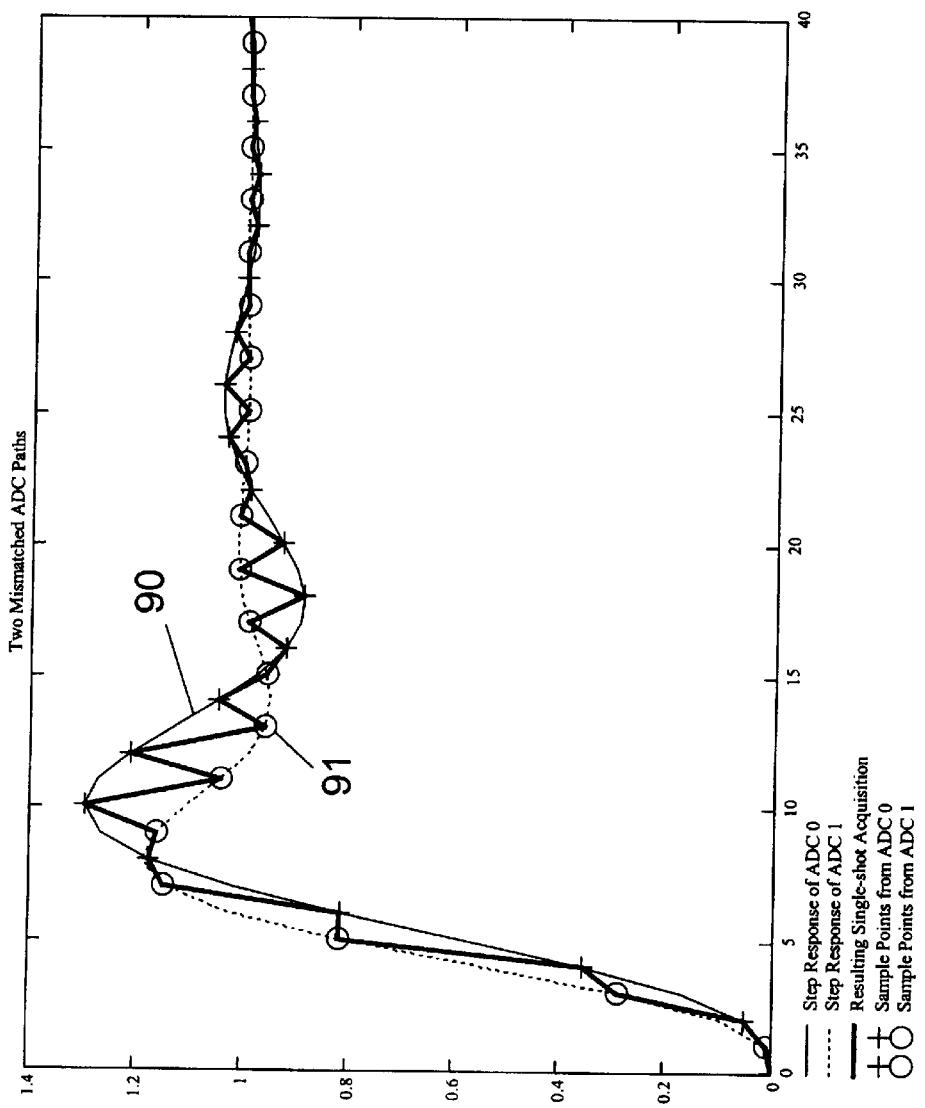

FIG. 2 shows an interleaved system according to the present invention that matches the response of the digitizers using sample synthesis. In FIG. 2, the traditional interleaved system shown in FIG. 8; is modified by connecting a bank of filters, collectively called a sample synthesizer 25, to each ADC 24. Each ADC has a corresponding sample synthesizer. In this system, each sample synthesizer 25 provides input data to all other synthesizers, and accepts output data from all other synthesizers. Each output pin of a given synthesizer emulates the output of another synthesizer thereby producing data that has the matched characteristics of that digitizer. The final output 26 can therefore be taken from any output pin on any synthesizer.

Figure 3:
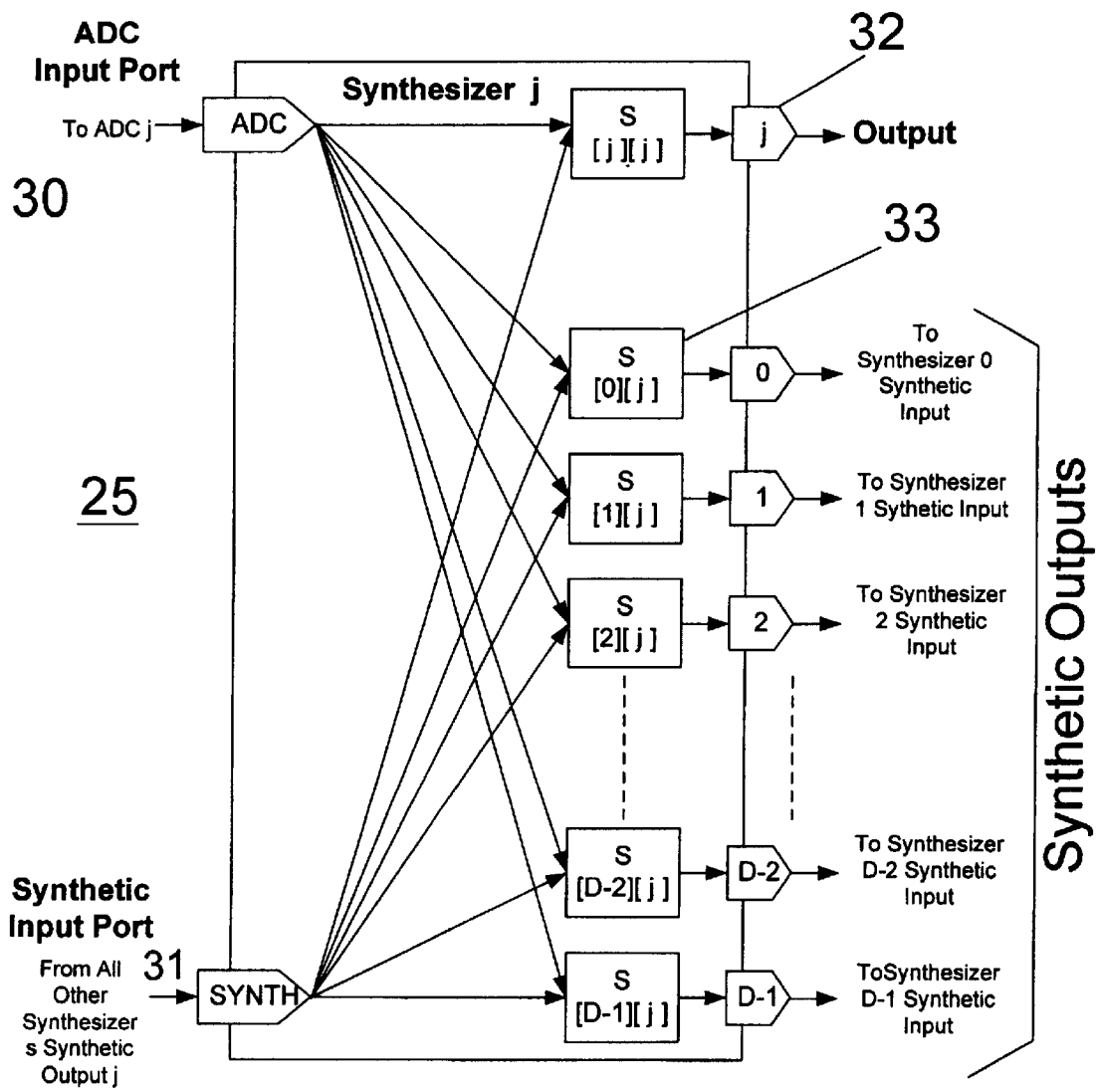
FIG. 3 is a detailed diagram of a single synthesizer block from the system shown in FIG. 2.

FIG. 3 is a detailed diagram of a single sample synthesizer 25 from the system shown in FIG. 2. Each sample synthesizer is provided with two input ports 30, 31. Input port 30 is connected to the corresponding ADC. Input port 31 is connected to the corresponding synthetic output pin on all of the other synthesizers. Each synthesizer 25 is designed to handle input and output data rates at the effective interleaved sample rate. The sample synthesizer has outputs 32 corresponding to each of the other digitizers in the system. Each sample synthesizer synthesizes inputs for each of the other synthesizers in the system. Each synthesizer contains a bank of filters 33. There is one filter S[i][j] 33 corresponding to each ADC in the system. The response of filter S[i][j] produces output data which mimics the sampling characteristics of ADC i, even though it was generated from ADC j. Thus, each synthesizer in the system provides outputs simulating the output from all other synthesizers in the system.

The operation of this system can be described by stepping through a few samples in FIG. 2. Assume that the ADC sampling order is 0, 1, 2 . . . D-1; i.e. there are D digitizers. When the first sample is received from ADC 0, it enters the ADC input pin on synthesizer 0. The sample then enters the bank of filters to produce D outputs (output 0 is simply the input while outputs 1 through D-1 are synthetic outputs). The synthetic outputs are samples that look as though sampled by ADCs 1 through D-1. These outputs are fed to the SYNTH input pins of synthesizers 1 through D-1. The filters in the other synthesizers then operate, if necessary, to produce any required outputs. Since generally none of the synthetic outputs from any of the other synthesizers are required (i.e. all synthesizers have already received synthetic inputs from synthesizer 0), no operation is required except to shift the input into the filter delay taps (not shown in FIG. 2). Next, ADC 1 acquires a sample that is fed into the ADC input pin on synthesizer 1. This sample enters the bank of filters in synthesizer 1 to produce its D outputs (output 1 is simply the input and outputs 0, 2, 3 . . . D-1 are synthetic outputs). These outputs are fed to the SYNTH input pins of synthesizers 0, 2, 3, . . . D-1 and look like samples acquired from these ADCs. This operation cycles through for each ADC and corresponding synthesizer; and repeats. Thus, each synthesizer, while receiving a large part of its input data from the synthetic outputs of other synthesizers, produces samples at its output pin at the interleaved sampling rate.

FIG. 1 shows an example configuration for an eight digitizer system according to the present invention showing the synthesizer structure and path connections. Note this diagram does not reflect the physical layout of such a system—the layout merely enhances the ability to distinguish the logical connections. The analog signal 1 is input and after buffering is present on the ring 2 surrounding the system. The signal is sampled by each of the ADCs 3 connected to the ring. The output of the ADCs is a digital signal. After treatment by the synthesizers 4, as previously described, the corrected waveform can be taken from any synthesizer output pin. The output pins are shown as spokes moving towards the center of the system. In FIG. 1, output 0 of synthesizer 0 is selected as the output 5 of the system.

In general, the synthesizer filter banks will be comprised of either Infinite Impulse Response (IIR) or Finite Impulse Response (FIR) filters. Although numerous other filter designs may be used. These designs are well known to those skilled in the art of digital signal processing. FIR filters generally afford the designer more flexibility in the design of the filter (e.g. the ability to control phase response), are always stable (they are all-zero filters with no poles), but are computationally intensive. On the other hand, IIR filters are more difficult to design (e.g. the fitting of poles and zeros in the response), offer numerical and stability problems, but are generally more computationally compact. The decision to use IIR or FIR filters generally centers on issues of suitability of design and computational compactness. For example, the IIR filter should be well suited to this type of design, since making one digitizer emulate another is a problem of pole/zero compensation or cancellation. However, the IIR filter is actually not well suited for this system because (as described later) computational compactness is not usually achieved.

Figure 4:
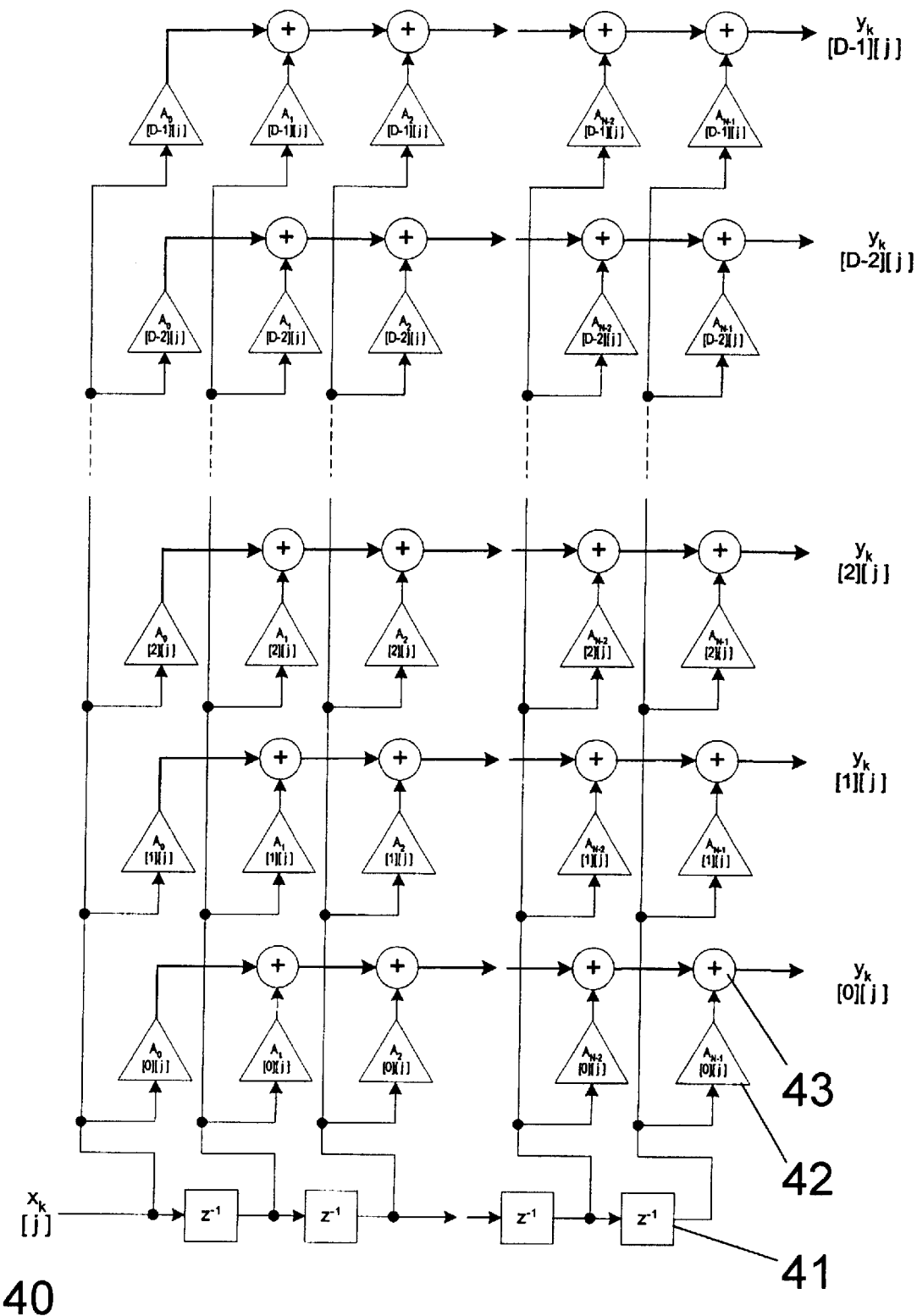
FIG. 4 shows the internal detail of a single synthesizer block, as shown in FIG. 3, implementing FIR filters.

FIG. 4 shows a FIR filter synthesizer structure. In this figure, the input enters as $X_k$ 40 from either the SYNTH or ADC input pin. The filter structure shown is such that:

$$S_{[i][j]}(z) = \sum_{n=0}^{N-1} A_{[i][j]}[n] \cdot z^{-n} \quad \text{Equation 1}$$

and that:

$$y_{[i][j]}[k] = \sum_{n=0}^{N-1} x[k-n] \cdot A_{[i][j]}[n] \quad \text{Equation 2}$$

Equation 1 provides the z domain transfer function of each FIR filter S[i][j] in synthesizer j shown in FIG. 3. Furthermore, Equation 2 provides the difference equation implementing the FIR filter. The value at output pin i in response to any input to synthesizer j is y[i][j], whether the input arrived from the ADC or the SYNTH pins.

Figure 5:
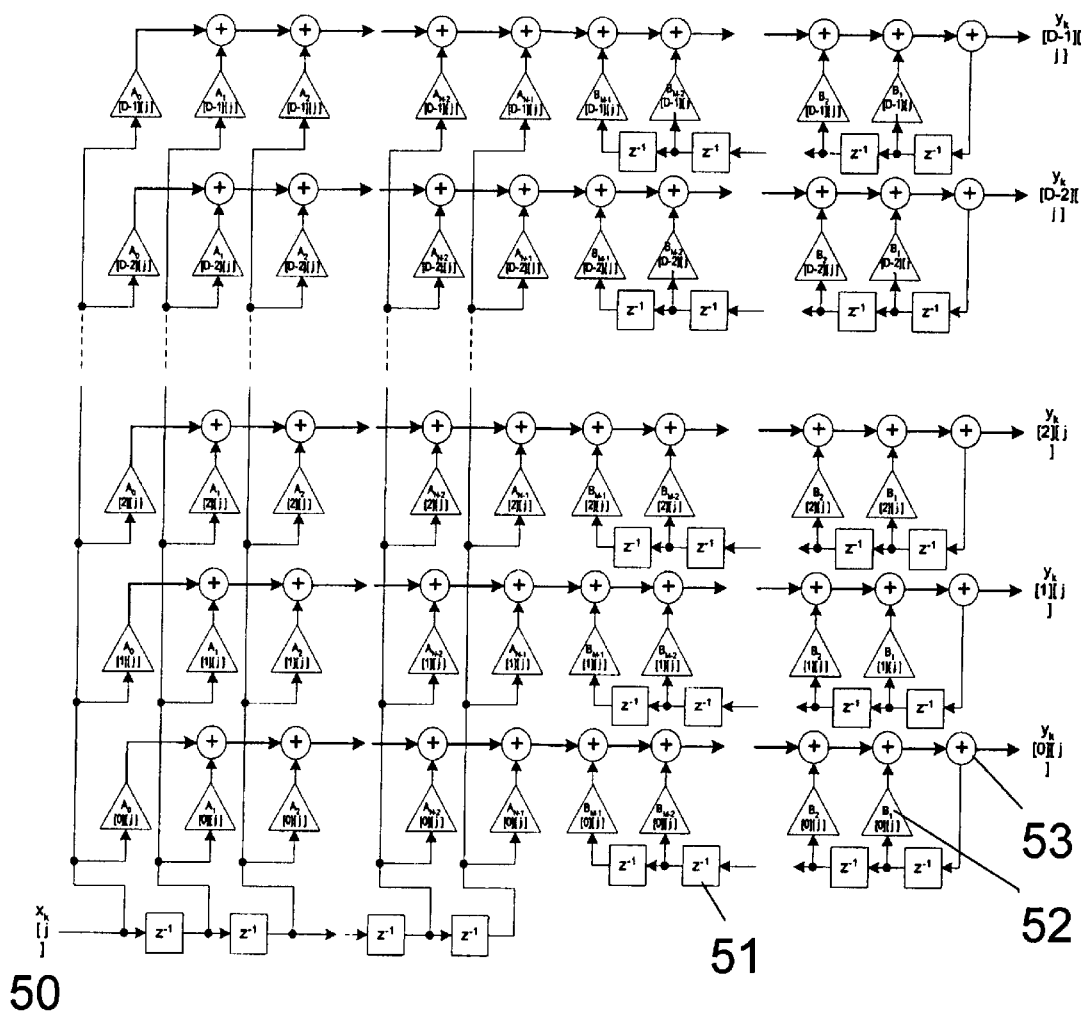
FIG. 5 shows the internal detail of a single synthesizer block, as shown in FIG. 3, implementing IIR filters.

FIG. 5 shows an IIR filter synthesizer structure. In this figure, the input enters as $X_k$ 50 from either the SYNTH or ADC input pin. The filter structure shown is such that:

$$S_{[i][j]}(z) = \frac{\sum_{n=0}^{N-1} A_{[i][j]}[n] \cdot z^{-n}}{1 - \sum_{n=1}^{M-1} B_{[i][j]}[n] \cdot z^{-n}} \quad \text{Equation 3}$$

and that:

$$y_{[i][j]}[k] = \sum_{n=0}^{N-1} x[k-n] \cdot A_{[i][j]}[n] + \sum_{n=1}^{N-1} y_{[i][j]}[k-n] \cdot B_{[i][j]}[n] \quad \text{Equation 4}$$

Note that in Equation 1 and Equation 3, $z=\exp(-s/F_s)$ where $F_s$ is the interleaved sampling rate, not the sample rate of an individual digitizer.

In both the FIR and IIR filter implementations, the input data passes through a single line of delay taps. In the FIR filter, the outputs are produced by applying different filters to the same set of input data. Hence, the FIR filter output depends only on the past inputs. Comparing the FIR and IIR filter implementations, reveals that the IIR implementation requires an additional set of delay taps for each output. For the IIR filter, the output must be calculated for each filter input regardless of whether the output is actually needed for that input in order to provide outputs for the delayed output taps of each synthetic output filter. Whereas, for the FIR filter there is no need to calculate the filters in the synthesizer unless an output is needed (all that is necessary is to shift an input in and propagate the others to the next delay tap). Therefore, unless the required filter is extremely large, the FIR filter will usually outperform the IIR filter in computational speed (plus offer all of the other benefits of the FIR).

FIG. 6 is a C-language software subroutine that implements the FIR filter portion of the present invention. The subroutine shown in FIG. 6 has been coded to optimize clarity—as opposed to execution speed—to provide an example for understanding how the filter operates. This subroutine may also serve as a model for hardware implementation. Before describing the operation in detail, note the FIR topology is implemented in floating point. Also, this coding actually moves the data through the input delay taps. This movement does not pose a problem for systems with a large write-behind cached data memory, but may have a significant impact on systems without such memory. In such cases, a circular buffer approach is recommended. Most DSP architectures provide zero overhead looping and automatic pointer wrapping to avoid this problem. The operation of this subroutine is as follows:

1. All accumulators (i.e. the adders 43 shown in FIG. 4) in the FIR filters are cleared. Note the relevant accumulators are those in the synthesizer of the ADC that is generating the sample. The accumulators in the other synthesizers are irrelevant since they are not generating outputs.
2. For every synthesizer, the values are shifted into the delay taps, starting with the oldest point. The values being shifted in the synthesizer are processed by the FIR filter for each synthesized output. This processing is performed on each point except the input point.
3. The input is then input to the delay taps of the synthesizer connected to the ADC generating the sample. The synthesized output is then generated and applied to the synthetic input pin of each synthesizer. Note, since the filter implementation is FIR, none of the outputs of the other synthesizers need to be calculated.
4. Finally, any output pin from any synthesizer may be used as the output of the system.

FIG. 7 is a software listing—equivalent to that shown in FIG. 6—which is optimized to move as little data as possible through the system, thereby reducing data bus activity. The optimization is in the form of a circular buffer delay tap arrangement. This arrangement only requires the advancing of an index (or pointer), rather than physical movement of the data. However, this arrangement adds some complexity to the process of applying the FIR filters.

The present invention is implemented on a LeCroy WavePro™ 960 digital sampling oscilloscope (DSO) by interleaving 16 digitizers, each sampling at 1 GS/s. This implementation results in a DSO that samples at a maximum sample rate of 16 GS/s, single-shot. The following is a description of this implementation.

The code in FIG. 6 and FIG. 7 was compiled and linked with existing software. The filters were implemented as 101 point FIR filters. No attempt was made to optimize the performance with regard to execution time beyond the optimization previously presented. The code was executed on a PowerPC 603E running at 150 MHz with write-behind data cache. Code execution times were approximately 200 $\mu$s per point, at approximately 30 MFLOPS. A call to the Match() function was made after the data was read out from the memories connected to the individual ADCs in the system. The Match() function is called as follows:

```
// N is the number of waveform points
// in [ ] is the input waveform
// D is the number of digitizers
// digitizer sampling order is 0, 1, . . . D-1
for (n = 0, n = N-1; ++n)
    out [n] = Match(in[n], n%D)
// out [ ] contains a corrected waveform
```

Figure 12:
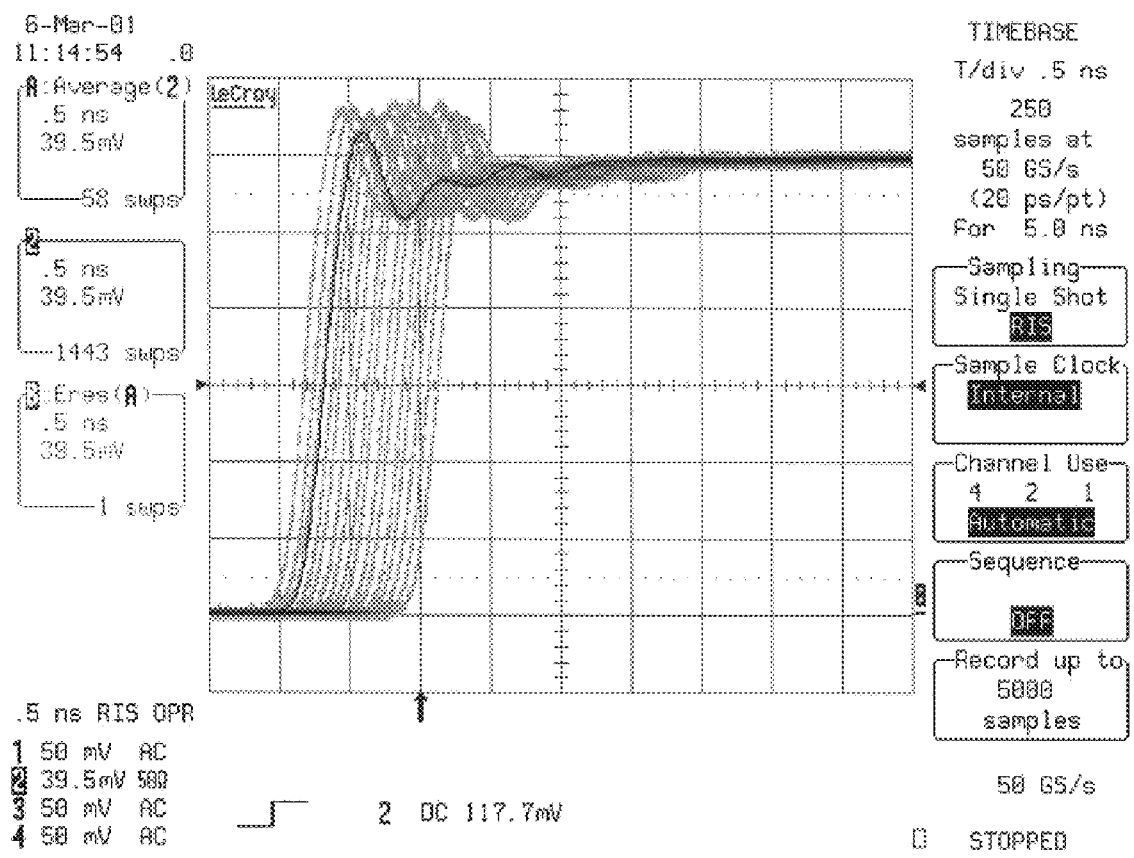
FIG. 12 shows the responses of the individual ADCs in the interleaved system that produces the degraded response shown in FIG. 10 and FIG. 11.
Figures 13A, 13B:
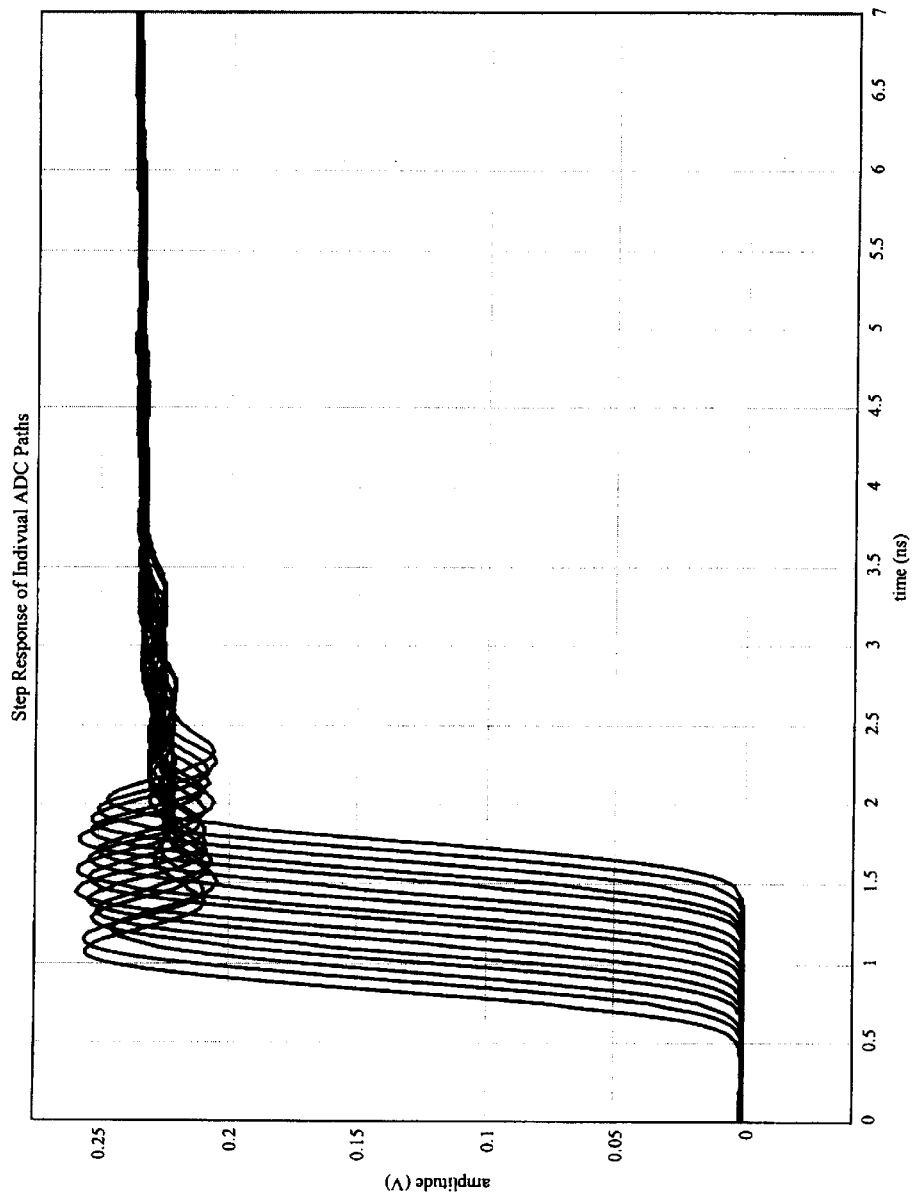
FIG. 13 shows the same ADC responses shown in FIG. 12 downloaded into a MathCAD file.
Figure 13B:
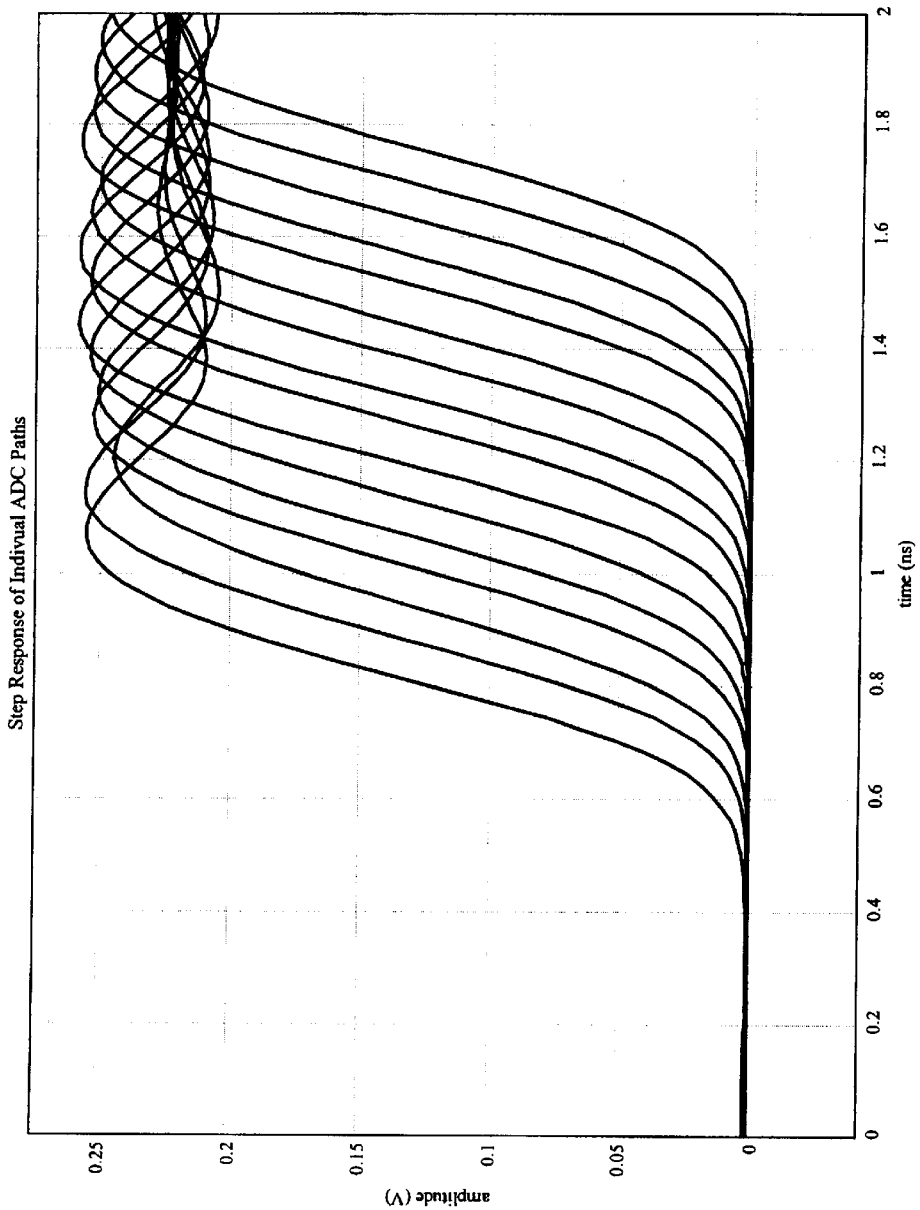

During one particular test, a Picosecond Pulse Labs 10070A was used to input a pulse signal to the DSO having a 75 ps rise time. The DSO was run in RIS mode with an equivalent time of 50 GS/s. The DSO was configured to output the response from each ADC path, averaged for at least 300 sweeps to reduce the noise. FIG. 12 shows the responses of the individual ADCs in the interleaved system that produce the degraded response shown in FIG. 10 and FIG. 11. The step responses from each ADC were loaded into a MathCAD 2000 file for further processing. FIG. 13 clearly shows the variation in the responses of each ADC.

Figure 14A:
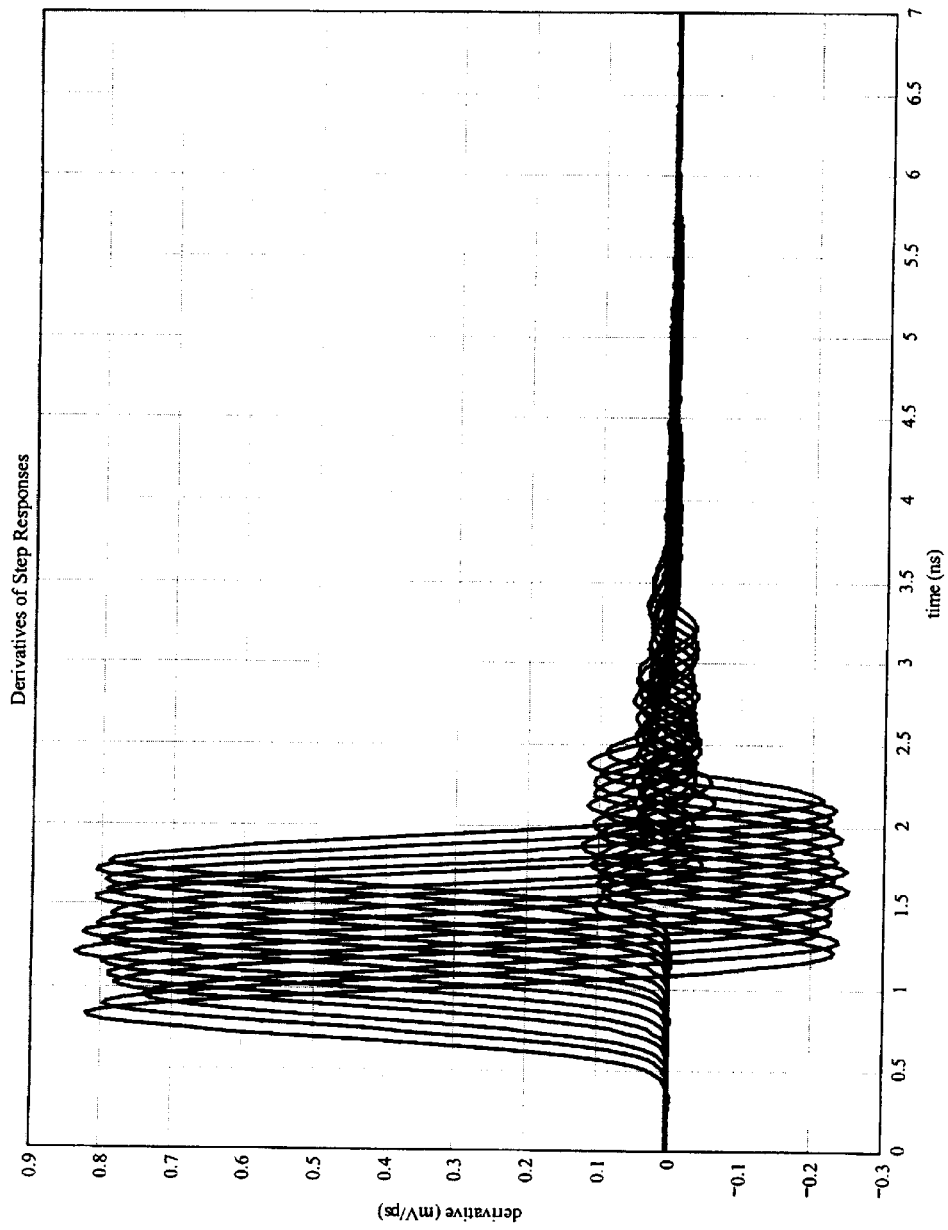
FIG. 14 shows the derivative of the responses shown in FIG. 13.
Figure 14B:
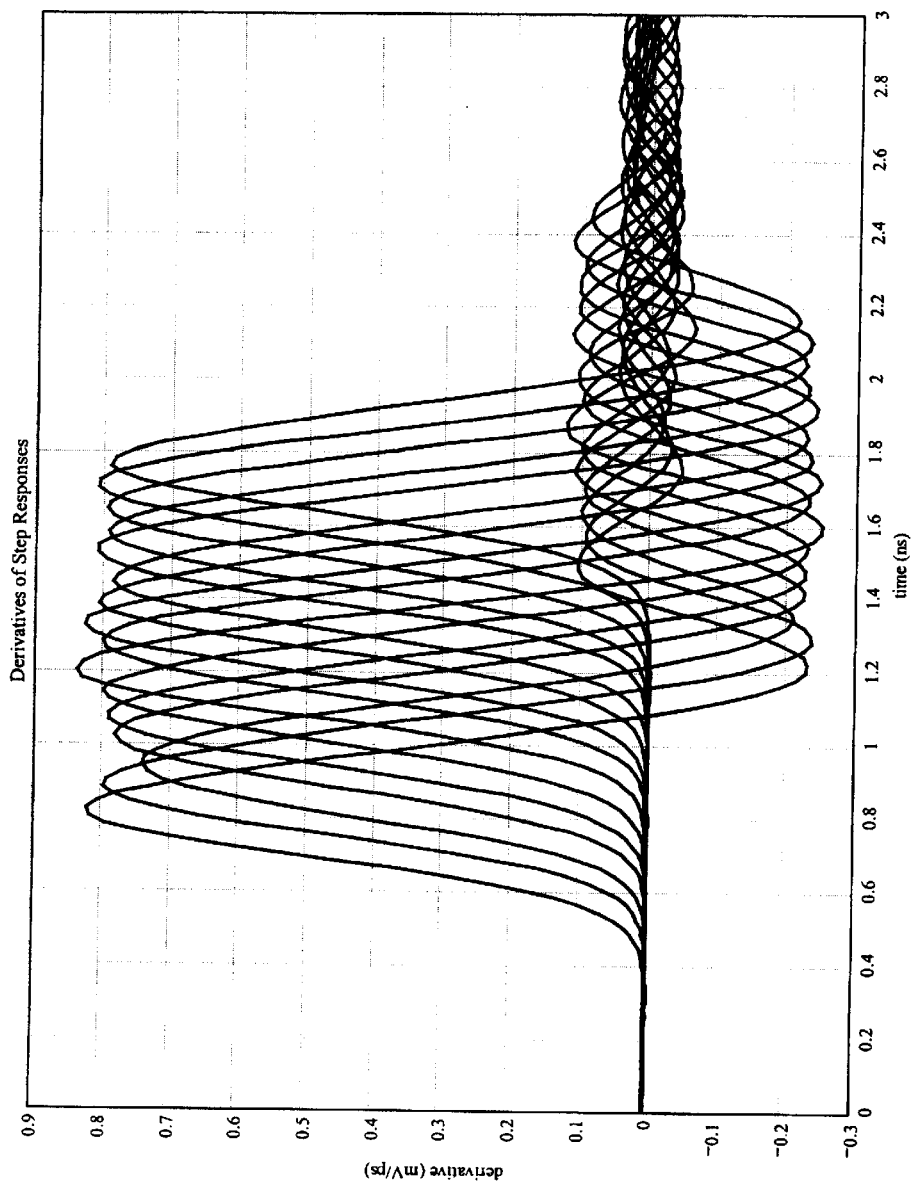
Figure 15A:
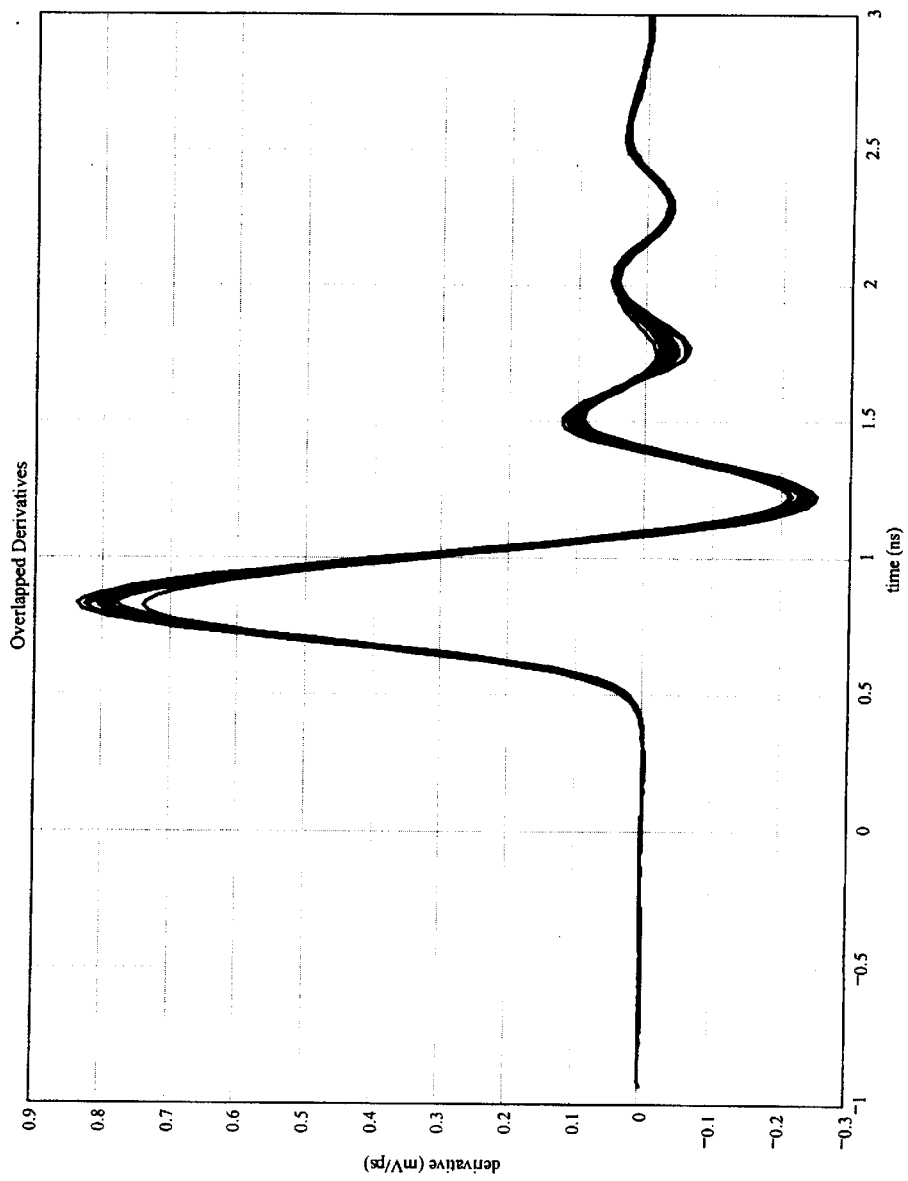
FIG. 15 shows the impulse responses shown in FIG. 14 with the time delay removed.
Figure 15B:
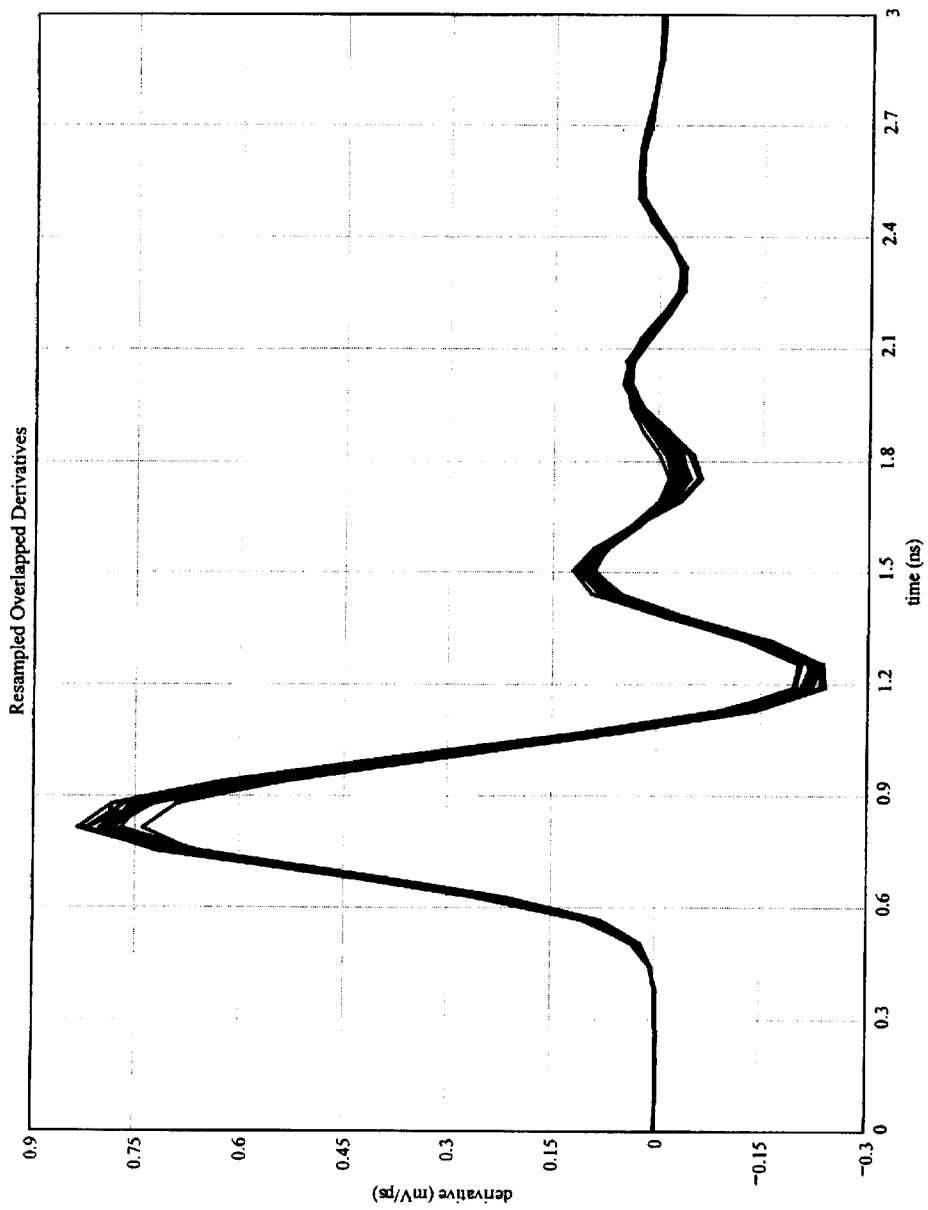

The impulse response of each ADC is then calculated by taking the derivative of the step response. FIG. 14 shows the derivatives of the responses shown in FIG. 13. The lack of noise in these derivatives is a direct result of the averaging and enhanced resolution processing used in the DSO. The sampling delay of each ADC path is then subtracted from the derivatives in FIG. 14 to produce the overlapped impulse response shown in FIG. 15. For the WavePro™ 960 running at 16 GS/s, the sampling delay between ADCs is an integer multiple of 62.5 ps. The derivative waveform is then resampled at 16 GS/s to provide the impulse responses at the interleaved sample rate.

Figure 16A:
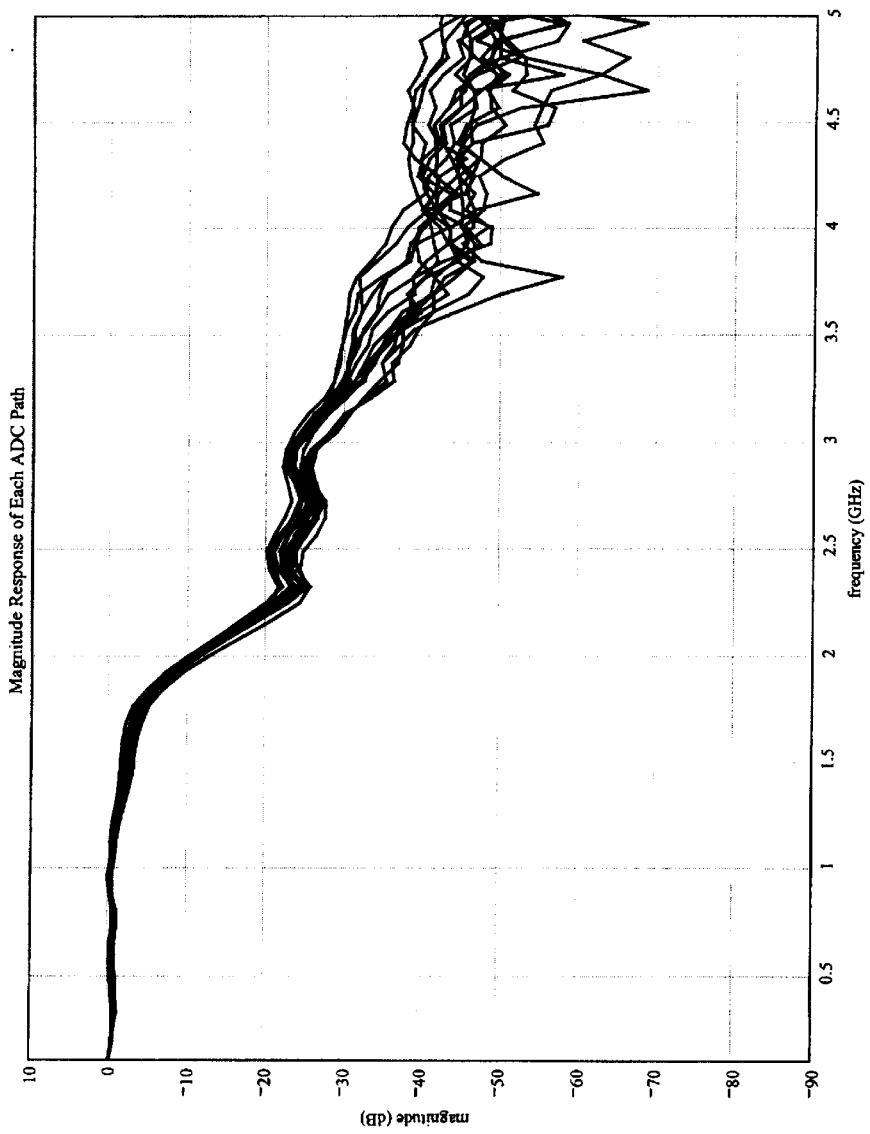
FIG. 16 shows the frequency response of each ADC, as calculated from the impulse responses shown in FIG. 15.
Figure 16B:
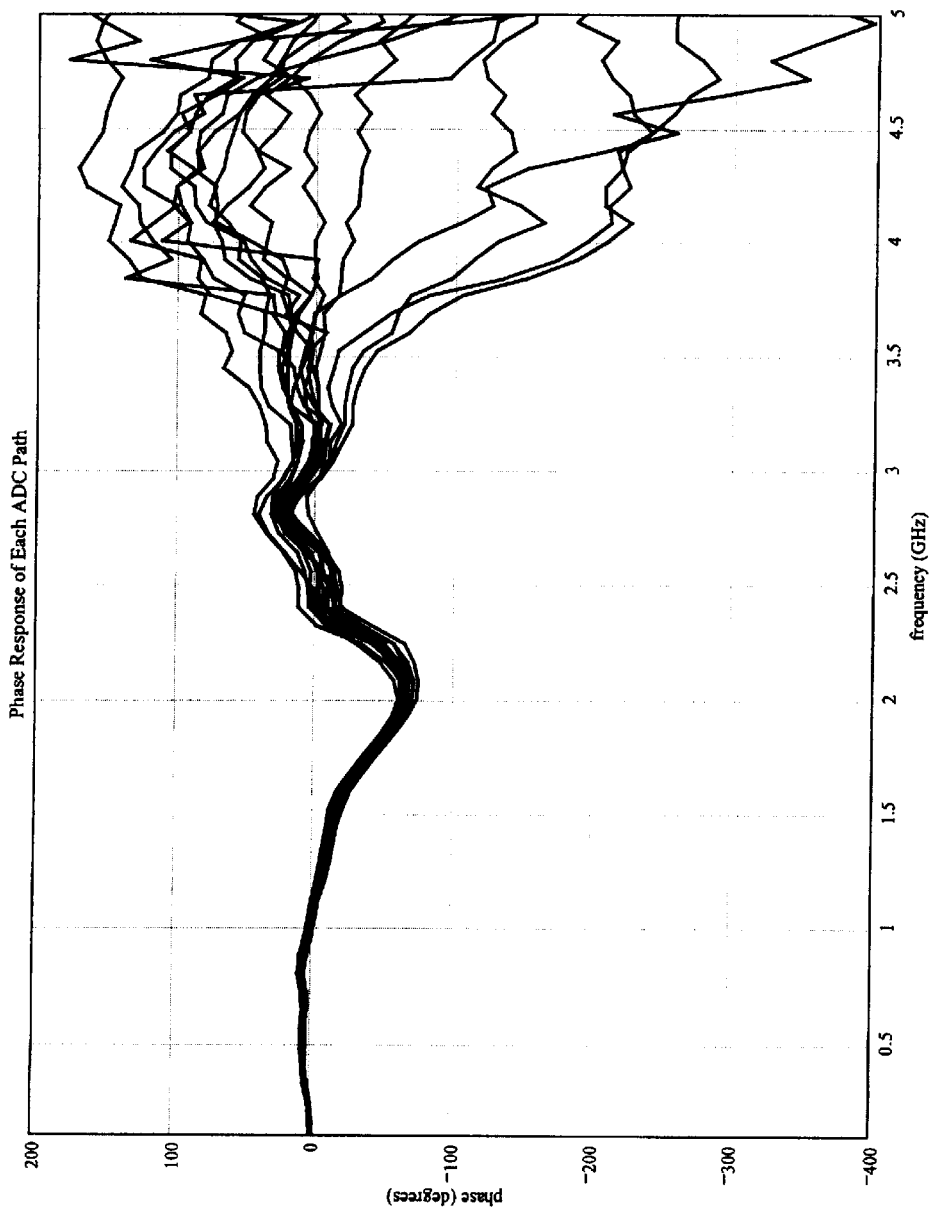

The frequency response of each ADC is calculated by deconvolving these impulse responses. The deconvolution is performed by zero-padding and taking the FFT of each impulse response. FIG. 16 shows the frequency response of each ADC, as calculated from the impulse responses shown in FIG. 15.

Figure 17A:
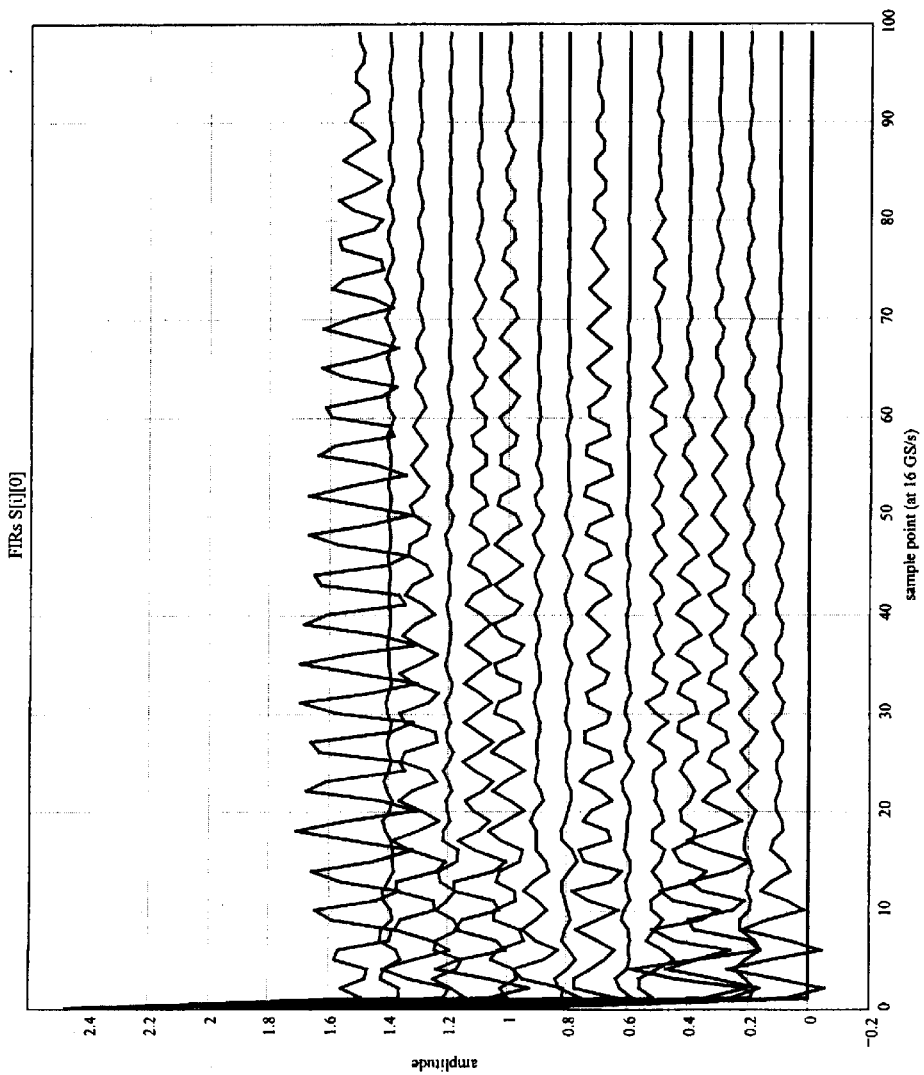
FIG. 17 shows exemplary FIR filters for synthesizing samples.
Figure 17B:
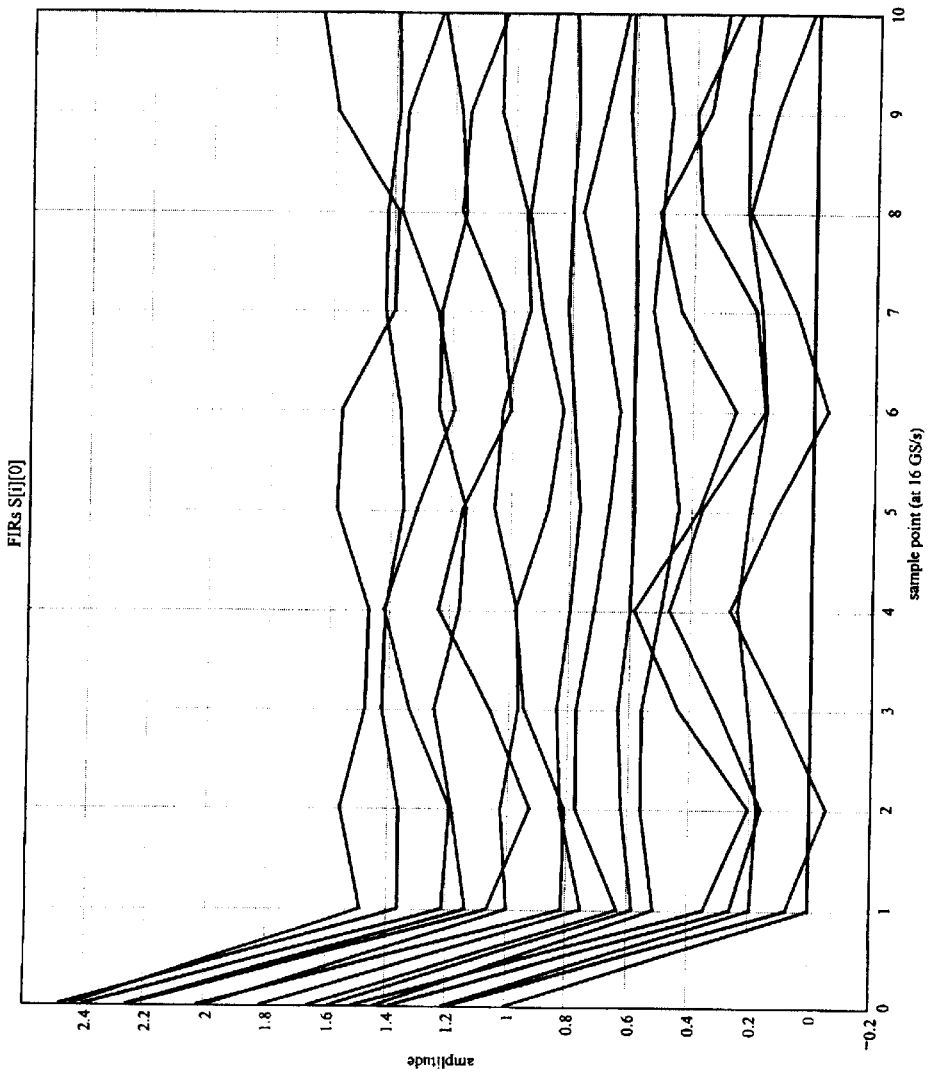

The FIR filters S[i][j] are then calculated by dividing the frequency response of ADC i by the response of ADC j and taking the inverse FFT of the result. Prior to the division operation, the frequency response of each ADC is monotonically rolled off to unity gain from 1.75 to 5.5 GHz using a raised cosine response function. Further, in this example, the inverse FFT is truncated at the 100th point. Each S[i][j] is the FIR filter required to convert inputs from ADC j into synthesized inputs from ADC i. FIG. 17 shows the FIR filters used to synthesize an input mimicking ADC i from an actual input on ADC 0. Note the filters are shown offset by 0.1 for easier viewing.

Figure 18B:
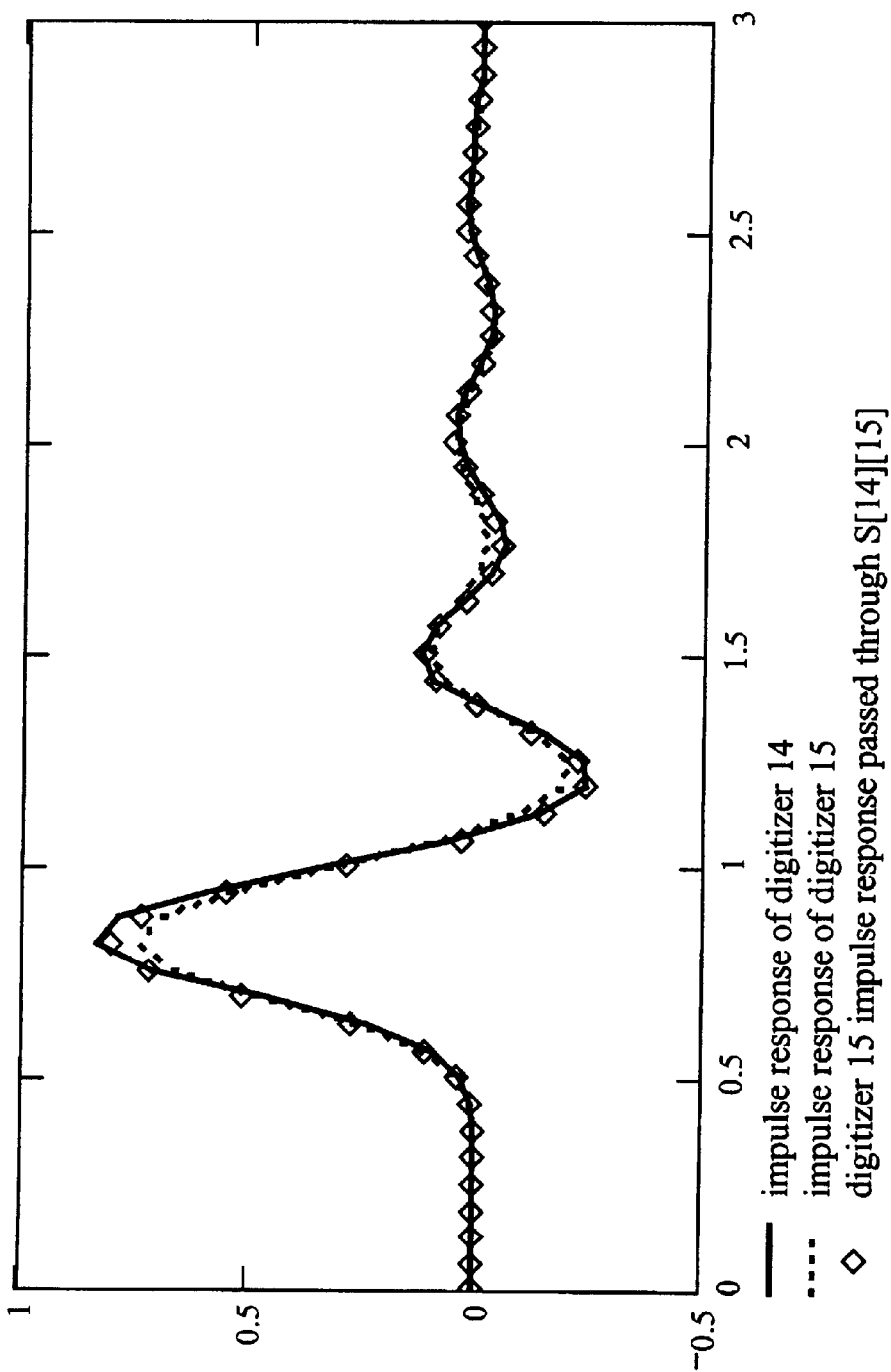
FIG. 18 shows the response of a filtered ADC matched to another ADC.
Figure 18D:
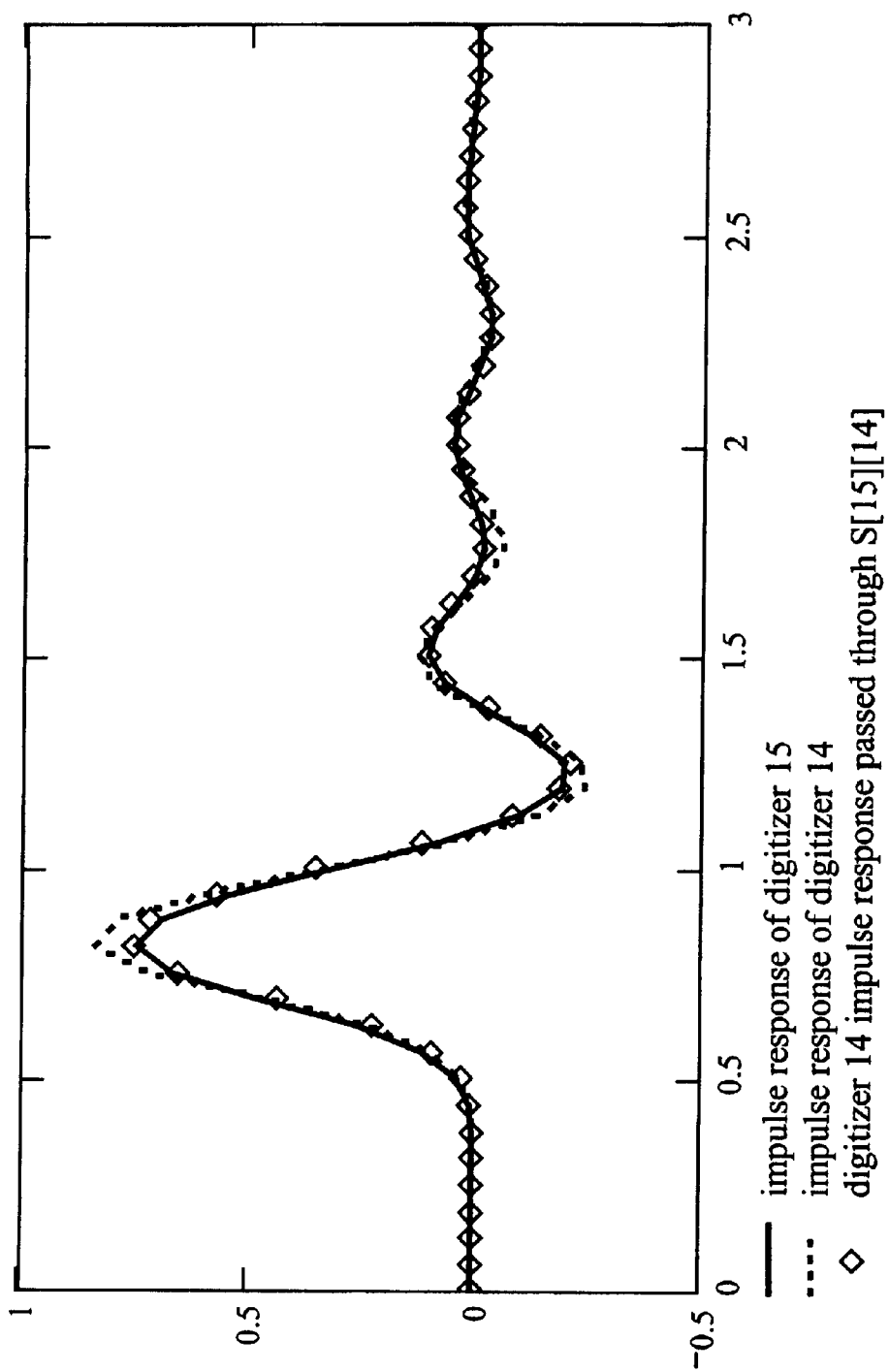

If the filters are designed properly, then the application of any of the impulses calculated on ADC j should look like the impulse calculated from ADC i if the impulse from ADC j were passed through the S[i][j] FIR. FIG. 18 shows four test applications of the FIR filters. The plots in FIG. 18 superimpose impulses sampled by the digitizer being synthesized (solid line), the test digitizer (dotted line), and the synthesized output from the test digitizer as processed by the FIR filter (diamond line). Ideally, the synthesized output (diamond line) will line up with the output from the digitizer being synthesized (solid line). This test is important because the ability to make samples from one ADC look like samples from another ADC is one key feature of the invention.

Figure 10:
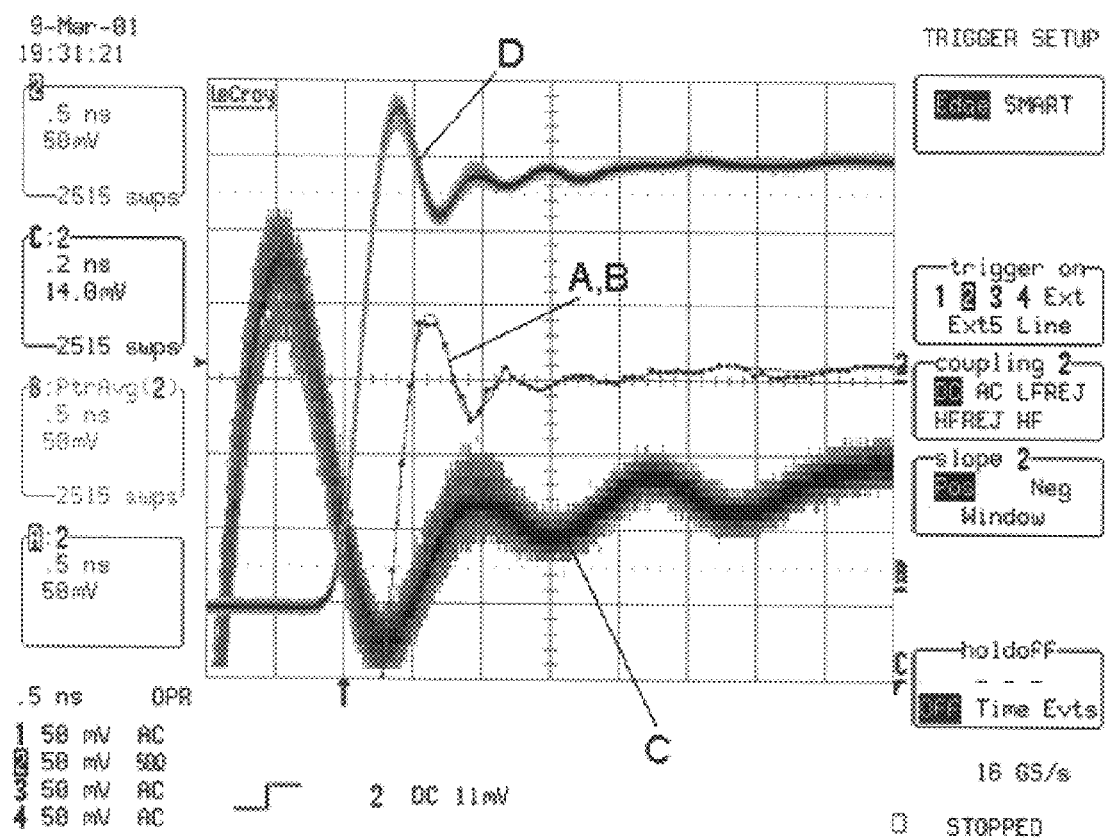
FIG. 10 shows the degraded response of an interleaved system having 16 ADCs.
Figure 19:
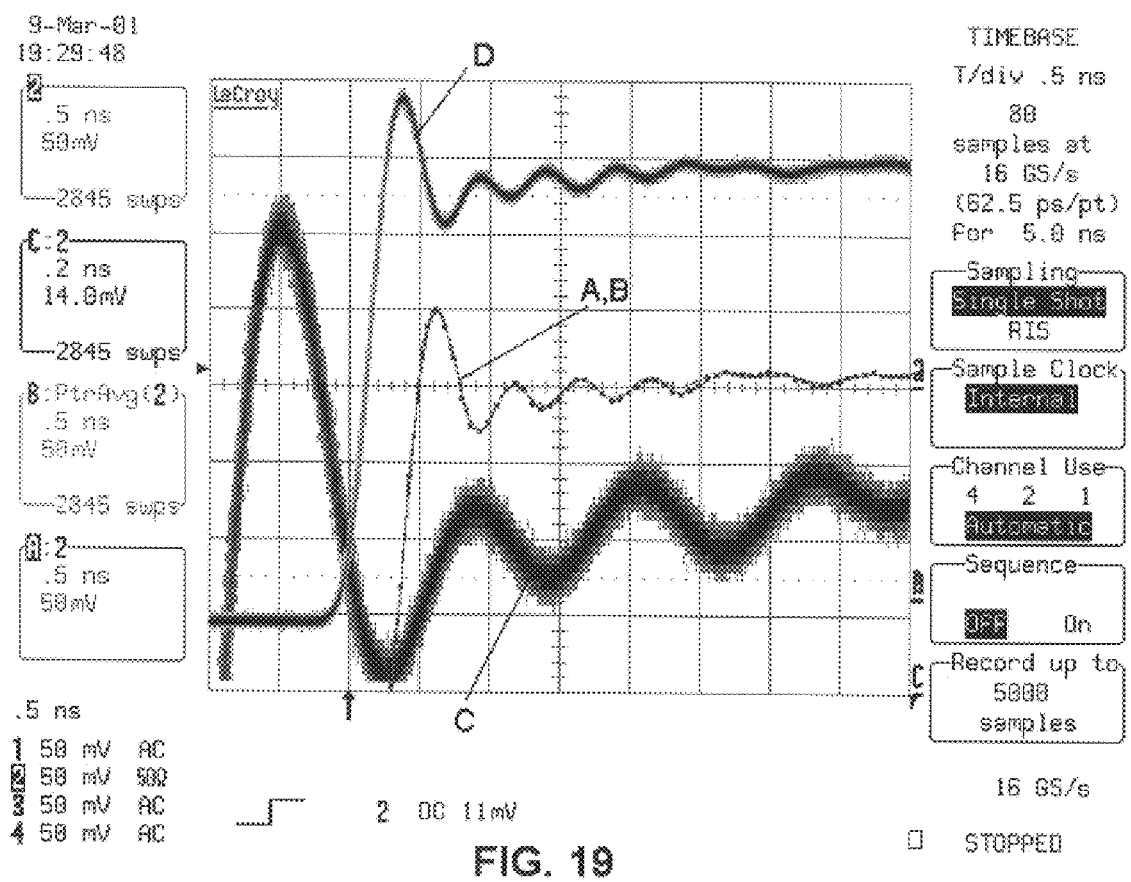
FIG. 19 shows the improved response for the system shown in FIG. 10 using sample synthesis according to the present invention.
Figure 20:
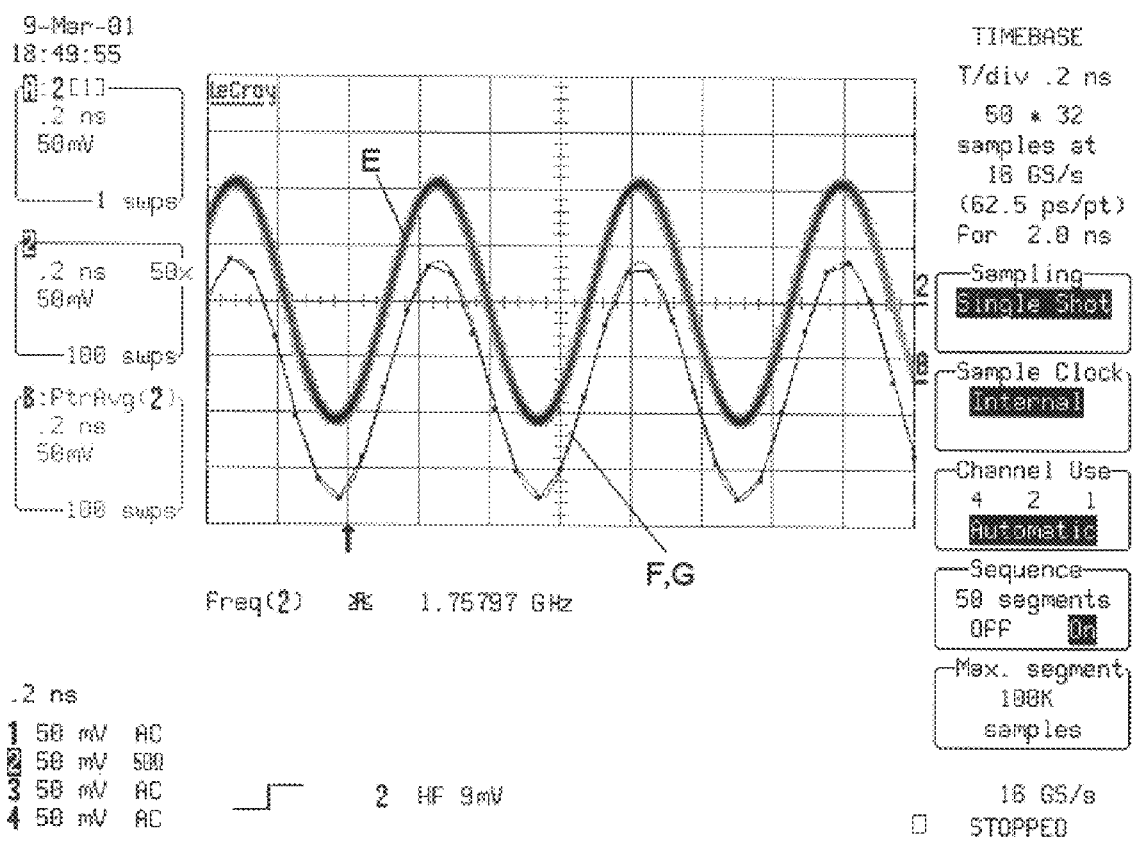
FIG. 20 shows the improved response for the system shown in FIG. 11 using sample synthesis according to the present invention.

FIG. 19 shows the improved response for the system shown in FIG. 10 using sample synthesis according to the present invention. Likewise, FIG. 20 shows the improved response for the system shown in FIG. 11. Each of these figures used the same WavePro™ 960 oscilloscope with and without the matching system employed.

FIGS. 10 and 19 show multiple corresponding traces, A thru D, of an input step signal having a rise time of approximately 75 ps. The DSO was sampling at 16 GS/s, utilizing 16 digitizers each sampling at 1 GS/s. The oscilloscope was in the analog persistence display mode. Analog persistence shows the superimposed results of multiple waveform acquisitions. Trace D is a persistence trace of the input step applied to channel 2 of the DSO. Trace C is a zoom of the top of the step response in trace D. Trace C in FIG. 10 clearly shows the effect of the varying path transfer functions of the ADCs (i.e. a faint, separate runt trace can clearly be seen at the apex of the trace). Furthermore, trace C in FIG. 10 is blurred out to approximately 1 ns into the step (this is an indication of varying digitizer sampling efficiency). As expected, matched Trace C in FIG. 19—processed by the present invention—is much sharper. Trace B is an averaged persistence trace generated from trace D that best approximates the signal as actually acquired.

Trace A is a single sweep trace of channel 2. Note the interleaving artifact (i.e. the dent) in the top of the sweep in FIG. 10's Trace A. This artifact is not present in the input waveform and has been eliminated in the matched Trace A of FIG. 19.

Figure 11:
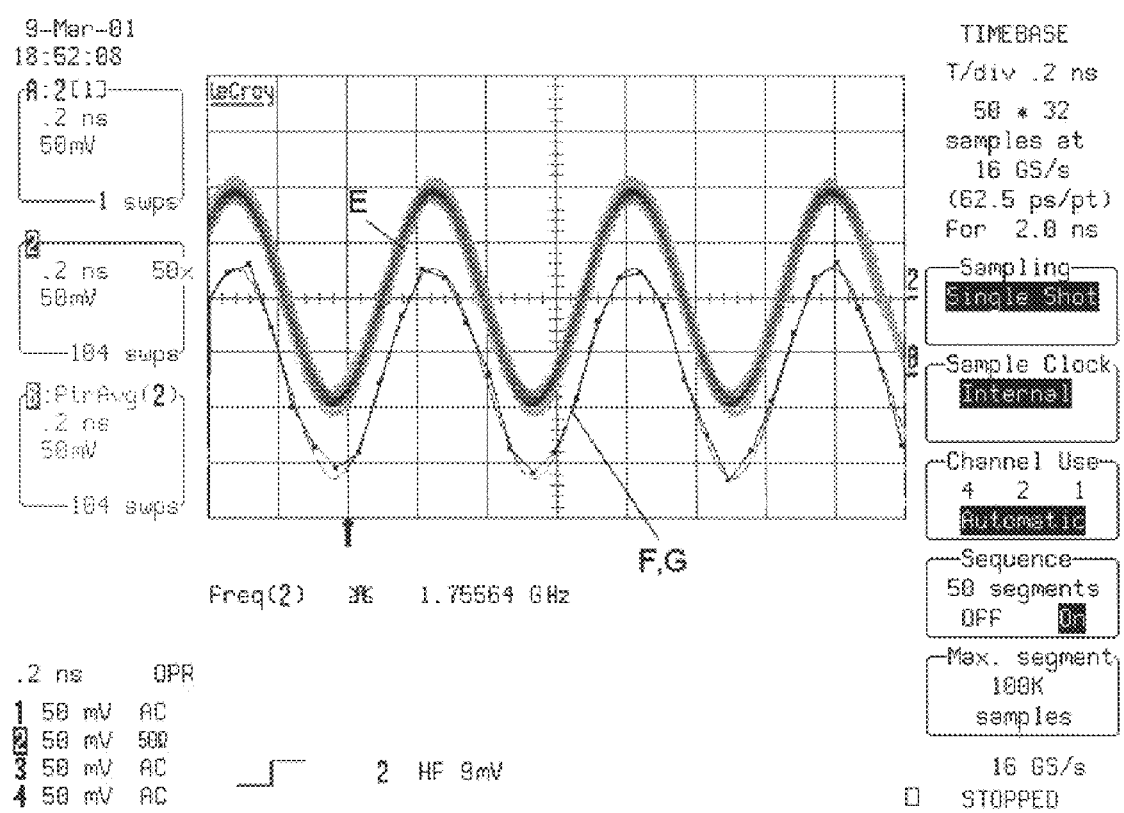
FIG. 11 shows the degraded response of an interleaved system having 16 ADCs.

Similarly, FIGS. 11 and 20 show multiple corresponding traces, E thru G, of an input 1.75 GHz sine wave. Trace E is a persistence display resulting from approximately 5000 sweeps. Multiple sine waves are clearly visible in the trace E of FIG. 11.

Whereas, FIG. 20's trace E is noticeably cleaner. Trace F is the average of the persistence display and is a good approximation of the actual input signal. Trace G is a single sweep overlaid on the "actual input" trace F. The differences between trace G and F in FIG. 11 are indicative of interleaving problems. As expected, these differences are significantly reduced in FIG. 20. These results illustrate the performance improvement attainable in interleaved systems using sample synthesis in accordance with the invention.

Three important practical considerations for implementing the present invention includes: 1) system stability; 2) memory requirements; and 3) processing requirements. Each of these considerations is subsequently explained.

Because every filter output is a function of both its inputs and its past outputs, an improperly designed system of this type may be unstable. This can be understood by the fact that all of the filter input data points come from other synthesizers whose outputs depend on the filter output itself (except for the data generated by the ADC connected to the synthesizer). Instability may be manifest as an unbounded synthesis output when a single impulse is applied. Note that the filters resulting from the design methodology presented in the preferred embodiment result in a stable system. However, other filter design methods tried during the development and testing of this invention did result in unstable systems.

The memory and processing requirements for a system using the FIR implementation of the present invention are now described. A system with D interleaved digitizers and K elements in the FIR (the FIR is order K−1), requires storage for $K * D * (D+1)+1$ values. For example, a 16 digitizer system using a 101-point FIR and 4 byte floating-point numbers, requires 107.3 Kbytes of storage. Note that this is independent of the waveform size.

For this FIR system, the processing requirements are $K*(D-1)$ multiply/accumulates (MACs) per point in the waveform. For the example above, the system performs 1,515 MACs per point (or approximately 3,030 floating-point operations per point). This means that for a 1 Mpoint waveform, over 3 billion floating point operations are required. The execution time will depend on the DSP or processor used, but DSPs capable of 1 GFLOP are available. Further, this method can usually be implemented at the sustained rate benchmarked by the DSP manufacturer and lends itself to parallel processing.

For an IIR implementation, consider a system having D digitizers, K points of input taps (the numerator of the z domain transfer function is order K−1), and M points of output taps (the denominator is order M). For this system the storage requirement is $K*D^2 *M+K*D+D^2 *M+1$ values (including the index) and the processing requirement is $(D-1)*(K+M)+(D-1)*(K+M)$ MACs. A reasonable estimate for the IIR filter implementation that might replace an FIR implementation would be an 8th order system (K=9, M=8) requiring 82.5 Kbytes of storage. The processing requirement for this system is 8,160 floating-point operations per point. This means that the IIR implementation will execute at only half the speed of its FIR counterpart, with only a modest decrease in the required memory. Note that these calculations are for a direct implementation of the IIR. Usually, IIR filters are implemented in stages, which should increase these calculations slightly.

While a preferred embodiment of the present invention has been described using specific terms, such description is for illustrative purposes only, and it is to be understood that changes and variations may be made without departing from the spirit or scope of the following claims.

What is claimed is:

1. A synthesizer for matching a plurality of interleaved digitizers in an acquisition system operating at an interleaved sampling rate, comprising:
   a digitizer input port for inputting a digitized waveform sample output from a corresponding one of said plurality of interleaved digitizers;
   a synthetic input port for inputting synthetic output samples corresponding to said synthesizer from a plurality of synthesizers corresponding to the other of said plurality of interleaved digitizers; and
   a filter bank having a plurality of filters; each filter corresponding to one of said plurality of interleaved digitizers; each filter producing an output sample from the input digitized waveform sample on the basis of the input synthetic output samples; each output sample having the sampling characteristics of the corresponding interleaved digitizer.

2. The synthesizer according to claim 1, wherein said output sample produced by the filter corresponding to the interleaved digitizer corresponding to said synthesizer is a matched output sample and the output samples produced by the filters corresponding to the other of said plurality of interleaved digitizers are synthetic output samples.

3. The synthesizer according to claim 1, wherein each filter is a finite impulse response (FIR) filter.

4. The synthesizer according to claim 1, wherein each filter is an infinite impulse response (IIR) filter.

5. The synthesizer according to claim 1, wherein each digitizer is an analog-to-digital converter (ADC).

6. A method of matching a plurality of interleaved digitizers in an acquisition system operating at an interleaved sampling rate, comprising the steps of:
   inputting a digitized waveform sample output from a corresponding one of said plurality of interleaved digitizers;
   inputting synthetic output samples corresponding to said synthesizer from a plurality of synthesizers corresponding to the other of said plurality of interleaved digitizers; and
   producing output samples from the input digitized waveform sample on the basis of the input synthetic output samples using a plurality of filters; each filter corresponding to one of said plurality of interleaved digitizers; each output sample having the sampling characteristics of the corresponding interleaved digitizer.

7. The method according to claim 6, wherein the output sample produced by the filter corresponding to the interleaved digitizer corresponding to said synthesizer is a matched output sample and the output samples produced by the filters corresponding to the other of said plurality of interleaved digitizers are synthetic output samples.

8. The method according to claim 6, wherein each filter is a finite impulse response (FIR) filter.

9. The method according to claim 6, wherein each filter is an infinite impulse response (IIR) filter.

10. The synthesizer according to claim 6, wherein each digitizer is an analog-to-digital converter (ADC).

11. A system for matching interleaved digitizers using sample synthesis, comprising:

a plurality of interleaved digitizers for sampling an input analog signal to produce digitized waveform samples; and a plurality of synthesizers corresponding to said plurality of interleaved digitizers; each synthesizer having:

a digitizer input port for inputting the digitized waveform samples output from the corresponding interleaved digitizers;

a synthetic input port for inputting synthetic output samples corresponding to said synthesizer from the other synthesizers; and a filter bank having a plurality of filters; each filter corresponding to one of said plurality of interleaved digitizers; each filter producing output samples from the input digitized waveform samples on the basis of the input synthetic output samples; each output sample having the sampling characteristics of the corresponding interleaved digitizer.

12. The system according to claim 11, wherein the output samples produced by the filter corresponding to the interleaved digitizer corresponding to said synthesizer are matched output samples and the output samples produced by the filters corresponding to the other of said plurality of interleaved digitizers are synthetic output samples.

13. The system according to claim 11, wherein each filter is a finite impulse response (FIR) filter.

14. The system according to claim 11, wherein each filter is an infinite impulse response (IIR) filter.

15. The system according to claim 11, wherein each digitizer is an analog-to-digital converter (ADC).

* * * * *